United States Patent
Chang et al.

(10) Patent No.: US 11,782,498 B2
(45) Date of Patent: Oct. 10, 2023

(54) ELECTRONIC DEVICE PERFORMING OUTLIER-AWARE APPROXIMATION CODING AND METHOD THEREOF

(71) Applicant: University-Industry Cooperation Group of Kyung Hee University, Yongin-si (KR)

(72) Inventors: Ik Joon Chang, Yongin-si (KR); Ho Nguyen Dong, Suwon-si (KR); Minhson Le, Suwon-si (KR)

(73) Assignee: University-Industry Cooperation Group of Kyung Hee University, Yongin-si (KR)

( * ) Notice: Subject to any disclaimer, the term of this patent is extended or adjusted under 35 U.S.C. 154(b) by 706 days.

(21) Appl. No.: 16/792,463

(22) Filed: Feb. 17, 2020

(65) Prior Publication Data

US 2021/0223852 A1 Jul. 22, 2021

(30) Foreign Application Priority Data

Jan. 17, 2020 (KR) .......................... 10-2020-0006851

(51) Int. Cl.
| | |
|---|---|
| *G06F 1/3234* | (2019.01) |
| *G06F 7/575* | (2006.01) |
| *G06N 3/063* | (2023.01) |
| *H03M 7/30* | (2006.01) |
| *G06F 7/74* | (2006.01) |

(52) U.S. Cl.
CPC ............ *G06F 1/3275* (2013.01); *G06F 7/575* (2013.01); *G06F 7/74* (2013.01); *G06N 3/063* (2013.01); *H03M 7/6058* (2013.01); *G06F 2207/4824* (2013.01)

(58) Field of Classification Search
CPC .............................. G06F 7/74; H03M 7/6058
See application file for complete search history.

(56) References Cited

U.S. PATENT DOCUMENTS

| | | | |
|---|---|---|---|
| 5,532,938 A * | 7/1996 | Kondo | G06F 9/3885 708/524 |
| 10,229,356 B1 * | 3/2019 | Liu | G10L 15/16 |
| 2018/0076828 A1 | 3/2018 | Kanno | |
| 2018/0275960 A1 | 9/2018 | Rovers | |
| 2018/0300606 A1 | 10/2018 | Corkery et al. | |
| 2022/0291739 A1 * | 9/2022 | Ko | G06N 3/0481 |

OTHER PUBLICATIONS

E. Park et al. 'Energy-efficient Neural Network Accelerator Based on Outlier-aware Low-precision Computation' *ACM/IEEE*, 2018, pp. 688-698.
S. Han et al. 'Deep Compression: Compressing Deep Neural Networks with Pruning, Trained Quantization and Huffman Coding' *ICLR*, 2016, pp. 1-14.
Lee, Donghyuk; Adaptive-Latency DRAM: Optimizing DRAM Timing for the Common-Case; Carnegie Mellon University, HPCA 2015.

* cited by examiner

*Primary Examiner* — Michael D. Yaary
(74) *Attorney, Agent, or Firm* — HARNESS, DICKEY & PIERCE, P.L.C.

(57) ABSTRACT

An electronic device includes a coding module that determines whether a parameter of an artificial neural network is an outlier, depending on a value of the parameter and compresses the parameter by truncating a first bit of the parameter when the parameter is a non-outlier and truncating a second bit of the parameter when the parameter is the outlier, and a decoding module that decodes a compressed parameter.

20 Claims, 18 Drawing Sheets

ELECTRONIC DEVICE PERFORMING OUTLIER-AWARE APPROXIMATION CODING AND METHOD THEREOF

CROSS-REFERENCE TO RELATED APPLICATIONS

This application claims priority under 35 U.S.C. § 119 to Korean Patent Application No. 10-2020-0006851 filed on Jan. 17, 2020, in the Korean Intellectual Property Office, the disclosures of which are incorporated by reference herein in their entireties.

BACKGROUND

Embodiments of the inventive concept disclosed herein relate to an electronic device and an operating method thereof, and more particularly, relate to an electronic device performing outlier-aware approximation coding and an operating method thereof.

An artificial intelligence technology that is based on an artificial neural network (ANN) similar to a biological neural network is being used in various fields such as image recognition, voice recognition, translation, search, deep learning, data collection and analysis, and autonomous driving. As hardware of a computing device develops, a deep neural network (DNN) including a plurality of hidden layers is being mainly used.

In learning, training, or inference of the neural network, a plurality of parameters may be generated, referenced, or updated. As these parameters increase in number, a capacity or the degree of integration of a memory device storing parameters or the number of memory devices storing the parameters is also increasing. Accordingly, it is necessary to reduce power consumption of a memory device that is required to execute a neural network.

SUMMARY

Embodiments of the inventive concept provide an electronic device performing outlier-aware approximation coding and an operating method thereof.

According to an exemplary embodiment, an electronic device includes a coding module that determines whether a parameter of an artificial neural network is an outlier, depending on a value of the parameter and compresses the parameter by truncating a first bit of the parameter when the parameter is a non-outlier and truncating a second bit of the parameter when the parameter is the outlier, and a decoding module that decodes a compressed parameter.

According to an exemplary embodiment, an operating method of an electronic device includes determining whether a parameter of an artificial neural network is an outlier, depending on a value of the parameter, truncating a first bit of the parameter when the parameter is a non-outlier and truncating a second bit of the parameter when the parameter is the outlier, and generating a compressed parameter by truncating one of the first bit and the second bit.

According to an exemplary embodiment, an electronic device includes a host executing an artificial neural network, a memory device, and a memory controller that determines whether a parameter of an artificial neural network is an outlier, depending on a value of the parameter, compresses the parameter by truncating a first bit of the parameter when the parameter is a non-outlier and truncating a second bit of the parameter when the parameter is the outlier, and transmits a compressed parameter to the memory device.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept will be described in detail and clearly to such an extent that an ordinary one in the art easily implements the inventive concept.

Figure 1:
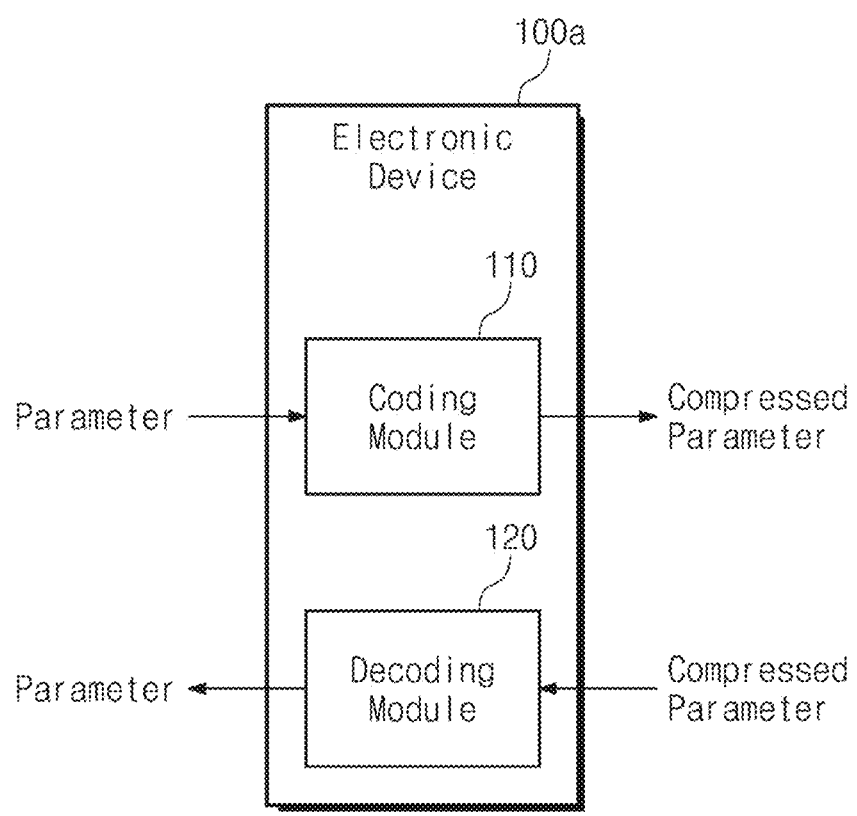
FIG. 1 illustrates a block diagram of an electronic device according to an embodiment of the inventive concept.

FIG. 1 illustrates a block diagram of an electronic device according to an embodiment of the inventive concept. An electronic device 100a may receive a parameter from the outside (e.g., refer to a host 1100 of FIG. 15 or a processor 2110 of FIG. 17). For example, the parameter may be associated with an artificial neural network (or an application program) such as a deep neural network and may include, but is not limited to, a weight parameter and an activation parameter of the artificial neural network. The electronic device 100a may compress the parameter and may transmit the compressed parameter to a memory device. The electronic device 100a may receive a compressed parameter from the memory device and may decompress the compressed parameter. The electronic device 100a may output the decompressed parameter to the outside.

The electronic device 100a may include a coding module 110 and a decoding module 120. Each of the coding module 110 and the decoding module 120 may be implemented in the form of hardware, software, or a combination thereof. The coding module 110 may compress (or encode) a parameter and may output the compressed parameter (or the encoded parameter). For example, the coding module 110 may be also referred to as a "compression circuit", an "encoding module", or an "encoding circuit". The decoding module 120 may decode, decompress, or restore the compressed parameter. For example, the decoding module 120 may be also referred to as a "decompression circuit" or a "decoding circuit". The decoding module 120 may output a parameter.

As described above, the electronic device 100a may transmit a compressed parameter to the memory device. For example, the coding module 110 of the electronic device 100a may compress a parameter by performing outlier-aware approximation (O-2A) coding. The electronic device 100a may not store a parameter provided from the outside in the memory device without modification, but it may store the compressed parameter to the memory device. Accordingly, power consumption or energy of the memory device may be reduced. Below, the outlier-aware approximation coding that is performed by the coding module 110 will be more fully described.

Figure 2:
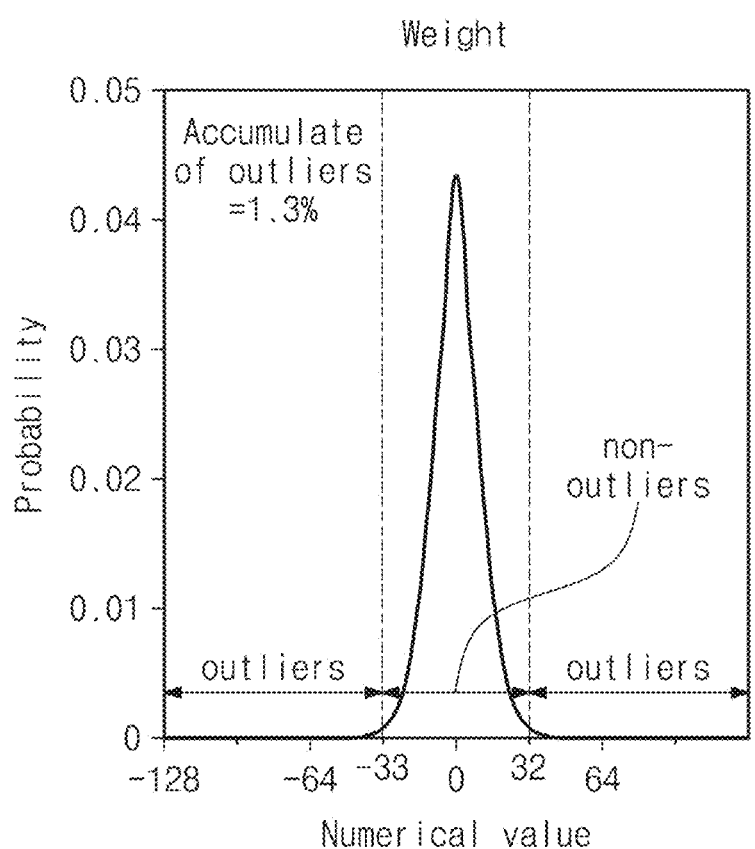
FIG. 2 illustrates distributions of parameters provided to an electronic device of FIG. 1.

FIG. 2 illustrates distributions of parameters provided to an electronic device of FIG. 1. In FIG. 2, a horizontal axis represents numerical values of weight parameters, and a vertical axis represents a probability of weight parameters. Each of weight parameters may be classified as an outlier or a non-outlier based on a reference value.

It is assumed that a weight parameter has an 8-bit signed format based on two's complement. Referring to a distribution of FIG. 2, three upper bits (i.e., three most significant bits (MSBs)) of a weight parameter that is a non-outlier and is a positive number may be "000", and three upper bits of a weight parameter that is a non-outlier and is a negative number may be "111". The remaining weight parameters may be outliers, and three upper bits of a weight parameter being an outlier may have any value being not "000" and "111". When an absolute value of a weight parameter being a positive number is less than the reference value (e.g., 32) (or is the reference value or less), the weight parameter may be a non-outlier. When an absolute value of a weight parameter being a positive number is the reference value (e.g., 32) or more (or exceeds the reference value), the weight parameter may be an outlier. When an absolute value of a weight parameter being a negative number is less than the reference value (e.g., 33) (or is the reference value or less), the weight parameter may be a non-outlier. When an absolute value of a weight parameter being a negative number is the reference value (e.g., 33) or more (or exceeds the reference value), the weight parameter may be an outlier.

Referring to the distribution of FIG. 2, a rate of weight parameters classified as an outlier may be only approximately 1.3% of all the weight parameters. The majority of all the weight parameters may be classified as a non-outlier, and the minority of all the weight parameters may be classified as an outlier. Three upper bits of each of weight parameters classified as a non-outlier may have a fixed value of "000" or "111". For example, the coding module 110 may compress three upper bits of a weight parameter classified as a non-outlier, based on the outlier-aware approximation coding. In detail, the coding module 110 may truncate the remaining upper bits other than a sign bit from among the three upper bits. Afterwards, the decoding module 120 may decompress a compressed weight parameter transmitted from a memory device, based on the outlier-aware approximation coding. In the case where a weight parameter classified as a non-outlier is stored in the memory device through the electronic device 100a, as described above, because weight parameters classified as a non-outlier are the majority of all weight parameters of the artificial neural network and have three upper bits being a fixed value, the accuracy-loss of the artificial neural network, which occurs due to compression of the weight parameters classified as a non-outlier, may be ignorable.

For example, the coding module 110 may compress and truncate two lower bits (i.e., two least significant bits (LSBs)) of a weight parameter classified as an outlier, based on the outlier-aware approximation coding. Afterwards, the decoding module 120 may decompress a compressed weight parameter transmitted from the memory device, based on the outlier-aware approximation coding. As described above, an absolute value of each of weight parameters classified as an outlier is the reference value or more (or exceeds the reference value). Accordingly, a difference between an absolute value of a weight parameter not compressed by the coding module 110 (i.e., a weight parameter in which two lower bits are not truncated) and an absolute value of a weight parameter, which is compressed by the coding module 110 and is decompressed by the decoding module 120, may be slight compared to an absolute value of a weight parameter not compressed by the coding module 110. Because weight parameters classified as an outlier are the minority of all the weight parameters of the artificial neural network and the above-described difference is slight, the accuracy-loss of the artificial neural network due to the compression of the weight parameters classified as an outlier may be ignorable.

Figure 3:
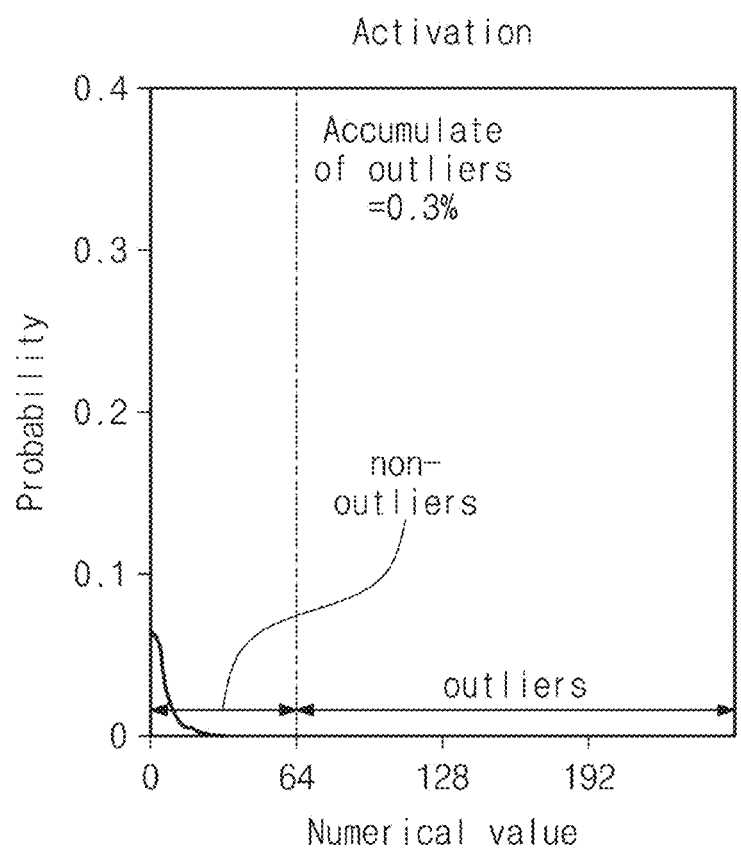
FIG. 3 illustrates distributions of parameters provided to an electronic device of FIG. 1.

FIG. 3 illustrates distributions of parameters provided to an electronic device of FIG. 1. In FIG. 3, a horizontal axis represents a numerical value of an activation parameter, and a vertical axis represents a probability of an activation parameter. As in the weight parameters, each of activation parameters may be classified as an outlier or a non-outlier based on a reference value.

It is assumed that an activation parameter has an 8-bit unsigned format. Referring to a distribution of FIG. 3, two upper bits (i.e., two MSBs) of an activation parameter being a non-outlier may be "00", and two upper bits of each of the remaining activation parameters may be any value being not "00". When an absolute value of an activation parameter is a reference value (e.g., 64) or more (or exceeds the reference value), the activation parameter may be an outlier. When an absolute value of an activation parameter is less than the reference value (e.g., 64) (or is the reference value or less), the activation parameter may be a non-outlier.

Referring to the distribution of FIG. 3, a rate of activation parameters classified as an outlier may be only approximately 0.3% of all the activation parameters. The majority of all the activation parameters may be classified as a non-outlier, and the minority of all the activation parameters may be classified as an outlier. Two upper bits of each of activation parameters classified as a non-outlier may have a fixed value of "00". For example, the coding module 110 may compress and truncate two upper bits of an activation parameter classified as a non-outlier, based on the outlier-aware approximation coding. Afterwards, the decoding module 120 may decompress a compressed activation parameter transmitted from the memory device, based on the outlier-aware approximation coding. In the case where an activation parameter classified as a non-outlier is stored in the memory device through the electronic device 100a, as described above, because activation parameters classified as a non-outlier are the majority of all activation parameters of the artificial neural network and have two upper bits being a fixed value, the accuracy-loss of the artificial neural network, which occurs due to the compression of the activation parameters classified as a non-outlier, may be ignorable.

For example, the coding module 110 may compress and truncate two lower bits (i.e., two LSBs) of an activation parameter classified as an outlier, based on the outlier-aware approximation coding. Afterwards, the decoding module 120 may decompress a compressed activation parameter transmitted from the memory device, based on the outlier-aware approximation coding. As described above, absolute values of activation parameters classified as an outlier are the reference value or more (or exceeds the reference value). Accordingly, a difference between an absolute value of an activation parameter not compressed by the coding module 110 (i.e., an activation parameter in which two lower bits are not truncated) and an absolute value of an activation parameter, which is compressed by the coding module 110 and is decompressed by the decoding module 120, may be slight compared to an absolute value of an activation parameter not compressed by the coding module 110. Because activation parameters classified as an outlier are the minority of all the activation parameters of the artificial neural network and the above-described difference is slight, the accuracy-loss of the artificial neural network due to the compression of the activation parameters classified as an outlier may be ignorable.

In an embodiment, a numerical value, a probability, and a rate described in FIGS. 2 and 3 are only an example. An example is described as the number of bits of a weight parameter is "8" and the number of bits of an activation parameter is "8", but the inventive concept is not limited thereto. For example, the number of bits may be determined depending on ranges of weight parameters and activation parameters used in the artificial neural network or a data input/output unit of a memory device. In an embodiment, a reference value for classifying a parameter as an outlier or a non-outlier is not limited to the example described in FIGS. 2 and 3. The number of bits having a fixed value from among bits of a weight parameter that is classified as a non-outlier based on a reference value, and positions of the bits having the fixed value are not limited to the example described in FIG. 2. Also, the number of bits having a fixed value from among bits of an activation parameter that is classified as a non-outlier based on a reference value, and positions of the bits having the fixed value are not limited to the example described in FIG. 3. In an embodiment, based on the outlier-aware approximation coding, the coding module 110 may truncate at least one bit of a weight parameter and may truncate at least one bit of an activation parameter. A position of at least one bit to be truncated from among bits of a parameter is not limited to the example described in FIGS. 2 and 3. In an embodiment, a format of a weight parameter and a format of an activation parameter are not limited to the above examples. Each of a weight parameter and an activation parameter may have a floating-point format.

Figure 4:
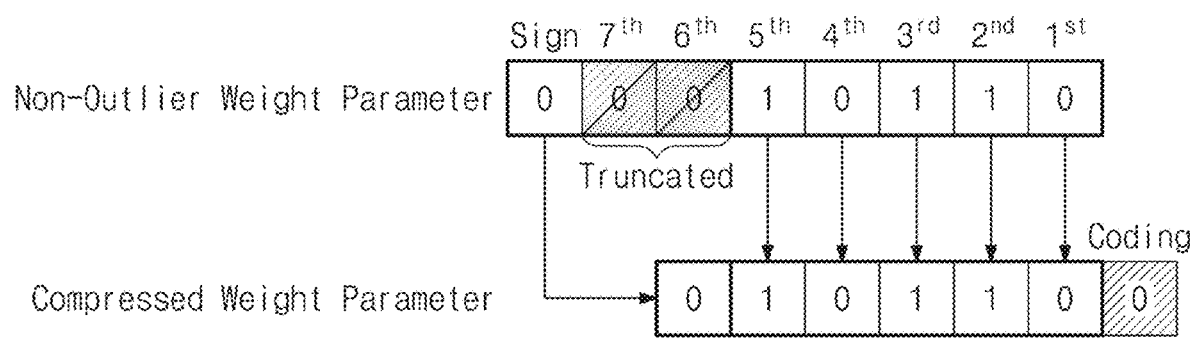
FIG. 4 illustrates an example in which a coding module of FIG. 1 classifies and compresses a weight parameter being a positive number as a non-outlier.

FIG. 4 illustrates an example in which a coding module of FIG. 1 classifies and compresses a weight parameter being a positive number as a non-outlier. It is assumed that a weight parameter is "00010110". The coding module 110 may compare the weight parameter and the reference value and may classify the weight parameter as a non-outlier. Three upper bits (i.e., a sign bit, a $7^{th}$ bit, and a $6^{th}$ bit) of the weight parameter may have a fixed value of "000". The coding module 110 may compress the weight parameter by truncating the remaining upper bits other than the sign bit from among the three upper bits. Except for the signal bit, the $7^{th}$ bit of the two truncated upper bits may correspond to an MSB of the weight parameter. Also, the coding module 110 may add a coding bit, which indicates that a weight parameter is a non-outlier and has a first value (e.g., "0"), to the compressed weight parameter. The weight parameter compressed by the coding module 110 may be "0101100".

Figure 5:
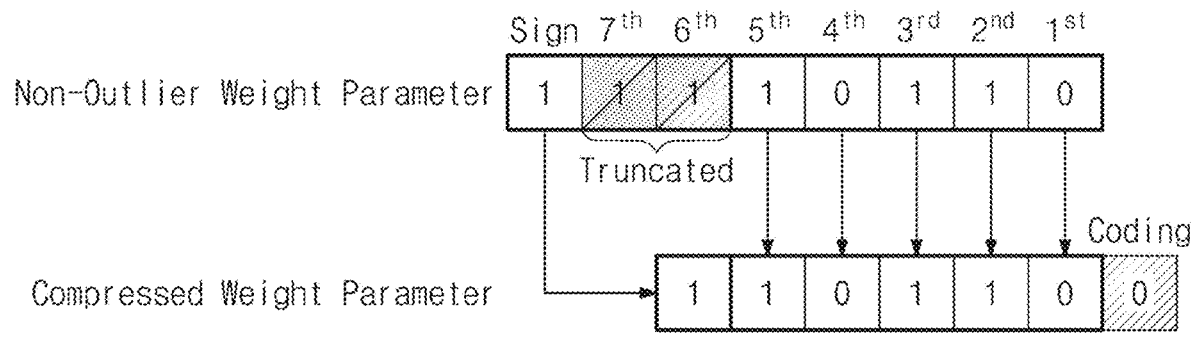
FIG. 5 illustrates an example in which a coding module of FIG. 1 classifies and compresses a weight parameter being a negative number as a non-outlier.

FIG. 5 illustrates an example in which a coding module of FIG. 1 classifies and compresses a weight parameter being a negative number as a non-outlier. It is assumed that a weight parameter is "11110110". The coding module 110 may compare the weight parameter and the reference value and may classify the weight parameter as a non-outlier. Three upper bits (i.e., a sign bit, a $7^{th}$ bit, and a $6^{th}$ bit) of the weight parameter may have a fixed value of "111". The coding module 110 may compress the weight parameter by truncating the remaining upper bits other than the sign bit from among the three upper bits. Also, the coding module 110 may add a coding bit, which indicates that a weight parameter is a non-outlier and has the first value, to the compressed weight parameter. The weight parameter compressed by the coding module 110 may be "1101100".

Figure 6:
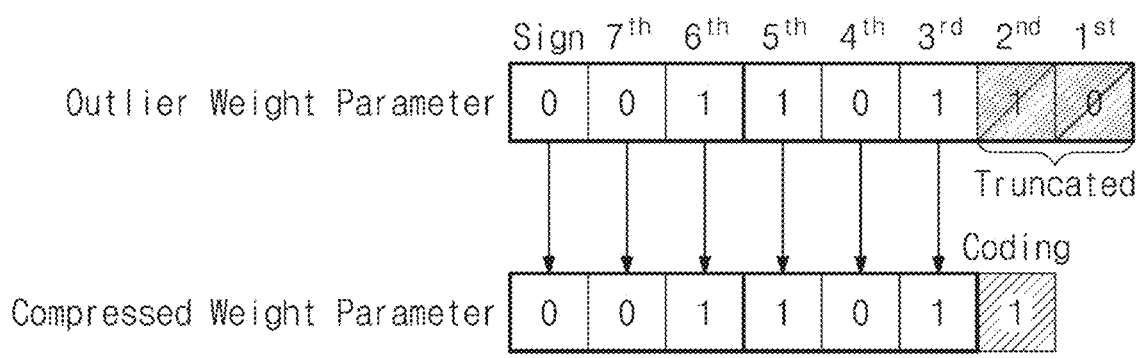
FIG. 6 illustrates an example in which a coding module of FIG. 1 classifies and compresses a weight parameter being a positive number as an outlier.

FIG. 6 illustrates an example in which a coding module of FIG. 1 classifies and compresses a weight parameter being a positive number as an outlier. It is assumed that a weight parameter is "00110110". The coding module 110 may compare the weight parameter and the reference value and may classify the weight parameter as an outlier. The coding module 110 may compress the weight parameter by truncating two lower bits. The first bit of the two truncated lower bits may correspond to an LSB of the weight parameter. Also, the coding module 110 may add a coding bit, which indicates that a weight parameter is an outlier and has a second value (e.g., "1"), to the compressed weight parameter. The weight parameter compressed by the coding module 110 may be "0011011".

Figure 7:
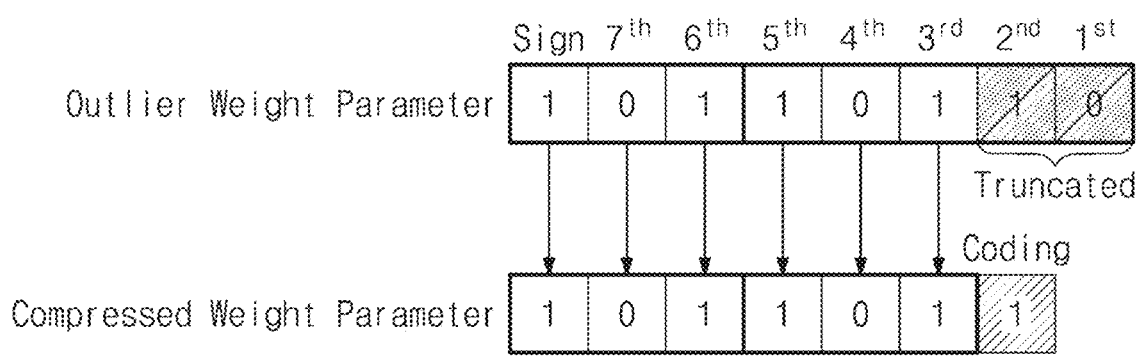
FIG. 7 illustrates an example in which a coding module of FIG. 1 classifies and compresses a weight parameter being a negative number as an outlier.

FIG. 7 illustrates an example in which a coding module of FIG. 1 classifies and compresses a weight parameter being a negative number as an outlier. It is assumed that a weight parameter is "10110110". The coding module 110 may compare the weight parameter and the reference value and may classify the weight parameter as an outlier. The coding module 110 may compress the weight parameter by truncating two lower bits. Also, the coding module 110 may add a coding bit, which indicates that a weight parameter is an outlier and has the second value, to the compressed weight parameter. The weight parameter compressed by the coding module 110 may be "1011011".

Figure 8:
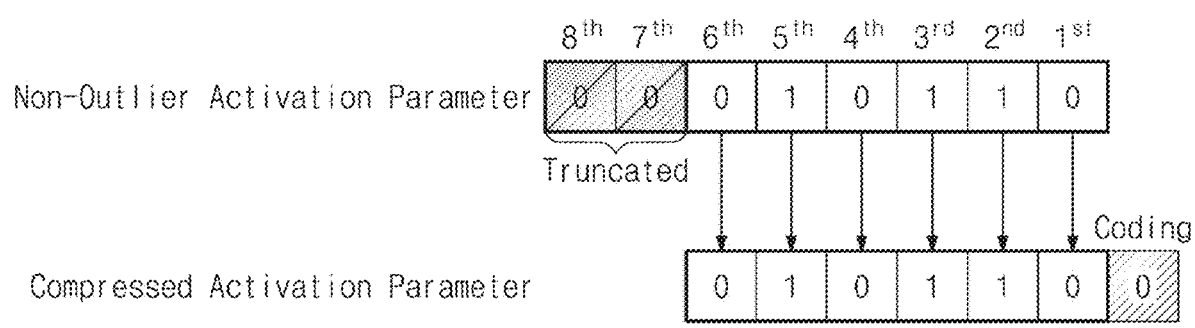
FIG. 8 illustrates an example in which a coding module of FIG. 1 classifies and compresses an activation parameter as a non-outlier.

FIG. 8 illustrates an example in which a coding module of FIG. 1 classifies and compresses an activation parameter as a non-outlier. It is assumed that an activation parameter is "00010110". The coding module 110 may compare the activation parameter and a reference value and may classify the activation parameter as a non-outlier. Two upper bits (i.e., an $8^{th}$ bit and a $7^{th}$ bit) of the activation parameter may have a fixed value of "00". The coding module 110 may compress the activation parameter by truncating two upper bits. The $8^{th}$ bit of the two truncated upper bits may correspond to an MSB of the activation parameter. Also, the coding module 110 may add a coding bit, which indicates that an activation parameter is a non-outlier and has the first value, to the compressed activation parameter. The activation parameter compressed by the coding module 110 may be "0101100".

Figure 9:
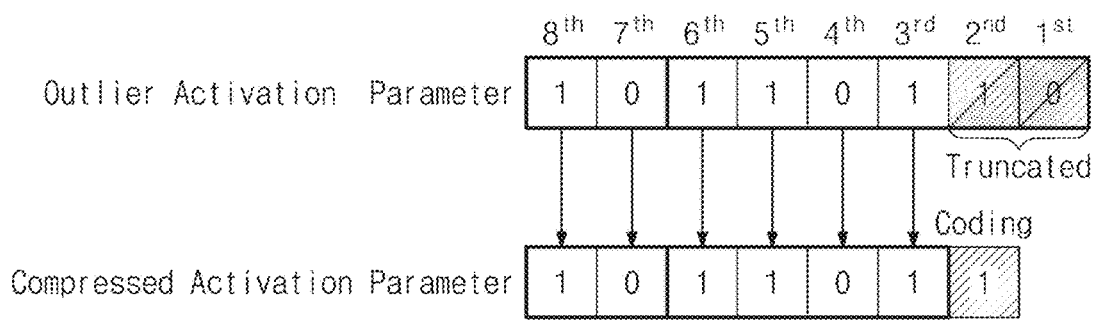
FIG. 9 illustrates an example in which a coding module of FIG. 1 classifies and compresses an activation parameter as an outlier.

FIG. 9 illustrates an example in which a coding module of FIG. 1 classifies and compresses an activation parameter as an outlier. It is assumed that an activation parameter is "10110110". The coding module 110 may compare the activation parameter and the reference value and may classify the activation parameter as an outlier. The coding module 110 may compress the activation parameter by truncating two lower bits. The first bit of the two truncated lower bits may correspond to an LSB of the activation parameter. Also, the coding module 110 may add a coding bit, which indicates that an activation parameter is an outlier and has the second value, to the compressed activation parameter. The activation parameter compressed by the coding module 110 may be "1011011".

The scope of the inventive concept is not limited to the weight/activation parameter values (or numerical values) described above. Also, a position of a coding bit of the compressed weight/activation parameter is illustrated as an LSB, but the inventive concept is not limited thereto. For example, the coding module 110 may place a coding bit at any bit position of the compressed weight/activation parameter, not the LSB. Also, the coding module 110 may truncate two or more bits of a weight/activation parameter, based on the outlier-aware approximation coding.

Figure 10:
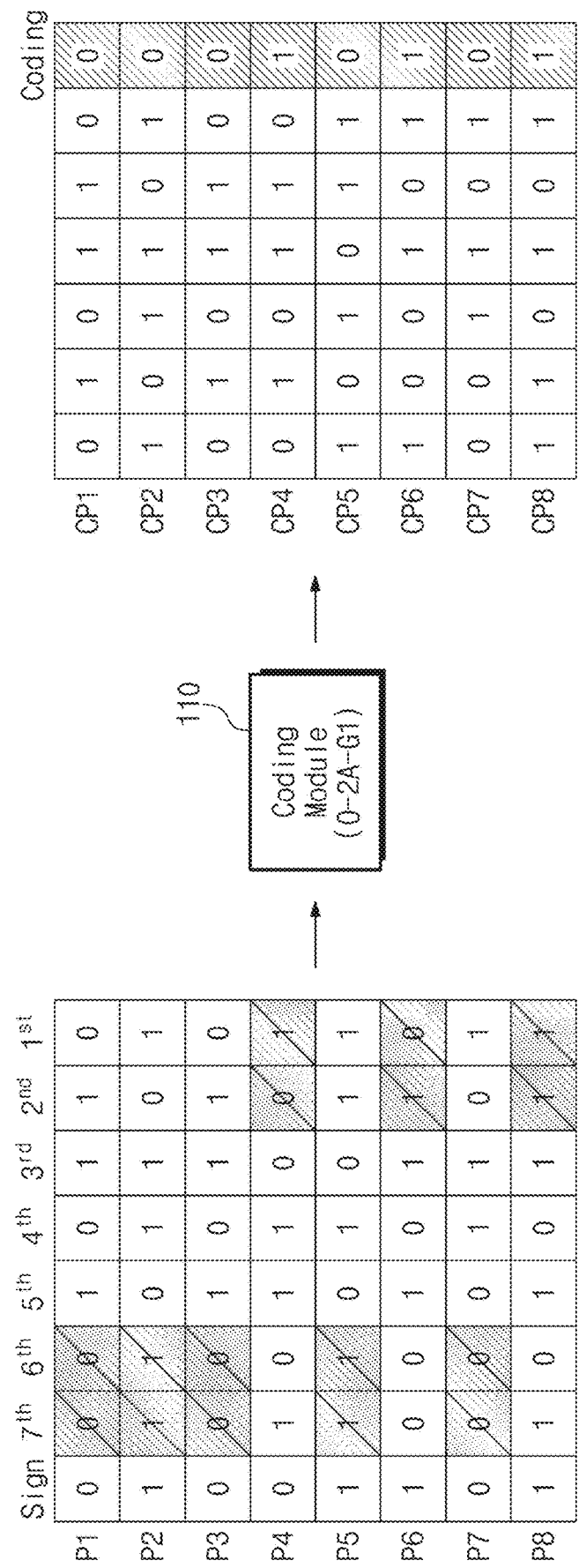
FIG. 10 illustrates an example in which a coding module of FIG. 1 compresses a plurality of weight parameters.

FIG. 10 illustrates an example in which a coding module of FIG. 1 compresses a plurality of weight parameters. The coding module 110 may compare each of a plurality of weight parameters P1 to P8 with a reference value; as a comparison result, the coding module 110 may classify the weight parameters P1, P2, P3, P5, and P7 as non-outliers and may classify the weight parameters P4, P6, and P8 as outliers. The coding module 110 may compress the weight parameters P1, P2, P3, P5, and P7 by truncating the remaining bits other than a sign bit from among three upper bits. Also, the coding module 110 may add a coding bit, which indicates that each of the weight parameters P1, P2, P3, P5, and P7 is a non-outlier and has the first value, to each of compressed weight parameters CP1, CP2, CP3, CP5, and CP7. The coding module 110 may compress the weight parameters P4, P6, and P8 by truncating two lower bits. Also, the coding module 110 may add a coding bit, which indicates that each of the weight parameters P4, P6, and P8 is an outlier and has the second value, to each of compressed weight parameters CP4, CP6, and CP8. The coding module 110 may respectively compress the plurality of weight parameters P1 to P8, based on the outlier-aware approximation coding O-2A-G1. Although not illustrated, the coding module 110 may compress each of a plurality of activation parameters based on the outlier-aware approximation coding O-2A-G1.

Figure 11:
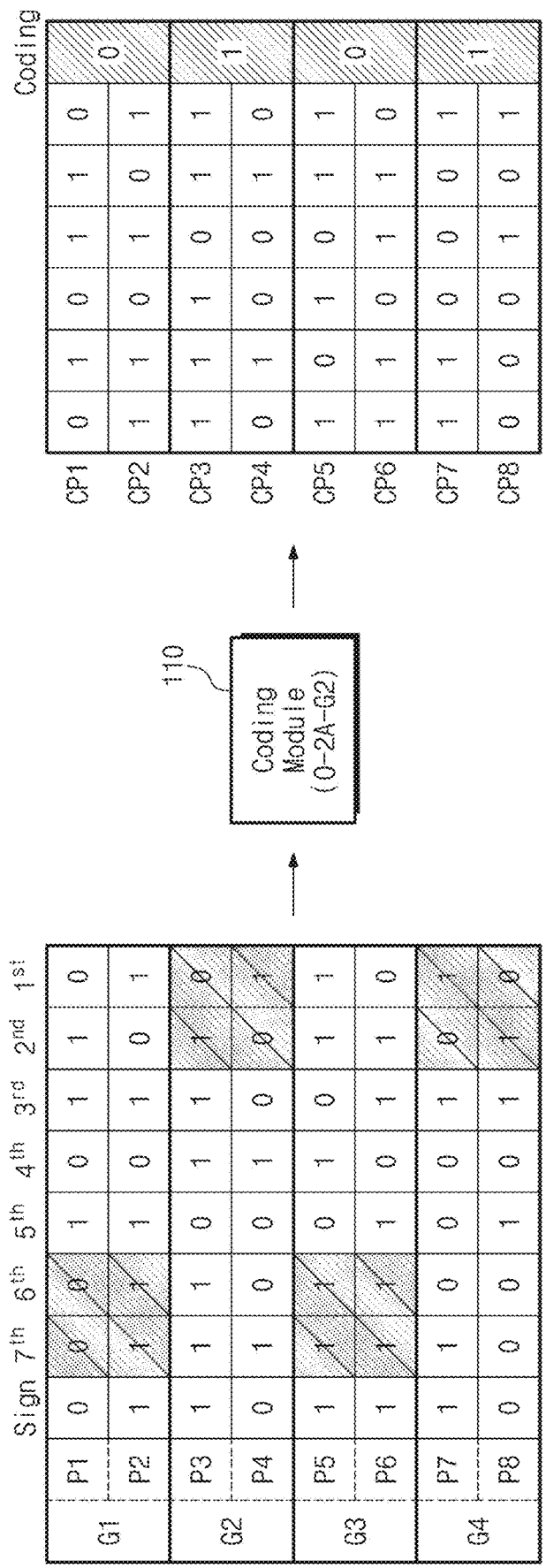
FIG. 11 illustrates an example in which a coding module of FIG. 1 groups and compresses a plurality of weight parameters.

FIG. 11 illustrates an example in which a coding module of FIG. 1 groups and compresses a plurality of weight parameters. The coding module 110 may group the plurality of weight parameters P1 to P8 into groups G1 to G4. For example, the number of weight parameters per group may be "2", but the inventive concept is not limited thereto. When at least one of weight parameters in one group is an outlier, the coding module 110 may truncate two lower bits of each of the weight parameters in the group. When all weight parameters in one group are a non-outlier, the coding module 110 may truncate two upper bits of each of the weight parameters in the group.

The coding module 110 may compare each of the weight parameters P1 and P2 of the group G1 with the reference value, may classify each of the weight parameters P1 and P2 as a non-outlier, may compress each of the weight parameters P1 and P2 by truncating the remaining bits other than a sign bit among three upper bits, and may add a coding bit, which indicates that all the weight parameters P1 and P2 of the group G1 are non-outliers and has the first value, to the compressed weight parameters CP1 and CP2. The coding module 110 may compare each of the weight parameters P3 and P4 of the group G2 with the reference value, may classify the weight parameter P3 as a non-outlier and the weight parameter P4 as an outlier, may compress each of the weight parameters P3 and P4 by truncating two lower bits, and may add a coding bit, which indicates that one of the weight parameters P3 and P4 of the group G2 is an outlier and has the second value, to the compressed weight parameters CP3 and CP4. The coding module 110 may compare each of the weight parameters P5 and P6 of the group G3 with the reference value, may classify each of the weight parameters P5 and P6 as a non-outlier, may compress each of the weight parameters P5 and P6 by truncating the remaining bits other than a sign bit among three upper bits, and may add a coding bit, which indicates that the weight parameters P5 and P6 are a non-outlier and has the first value, to the compressed weight parameters CP5 and CP6. The coding module 110 may compare each of the weight parameters P7 and P8 of the group G4 with the reference value, may classify the weight parameter P7 as an outlier and the weight parameter P8 as a non-outlier, may compress each of the weight parameters P7 and P8 by truncating two lower bits, and may add a coding bit, which indicates that one of the weight parameters P7 and P8 of the group G4 is an outlier and has the second value, to the compressed weight parameters CP7 and CP8. The coding module 110 may group and compress the plurality of weight parameters P1 to P8, based on the outlier-aware approximation coding O-2A-G2. Although not illustrated, the coding module 110 may group and compress a plurality of activation parameters based on the outlier-aware approximation coding O-2A-G2.

Figure 12:
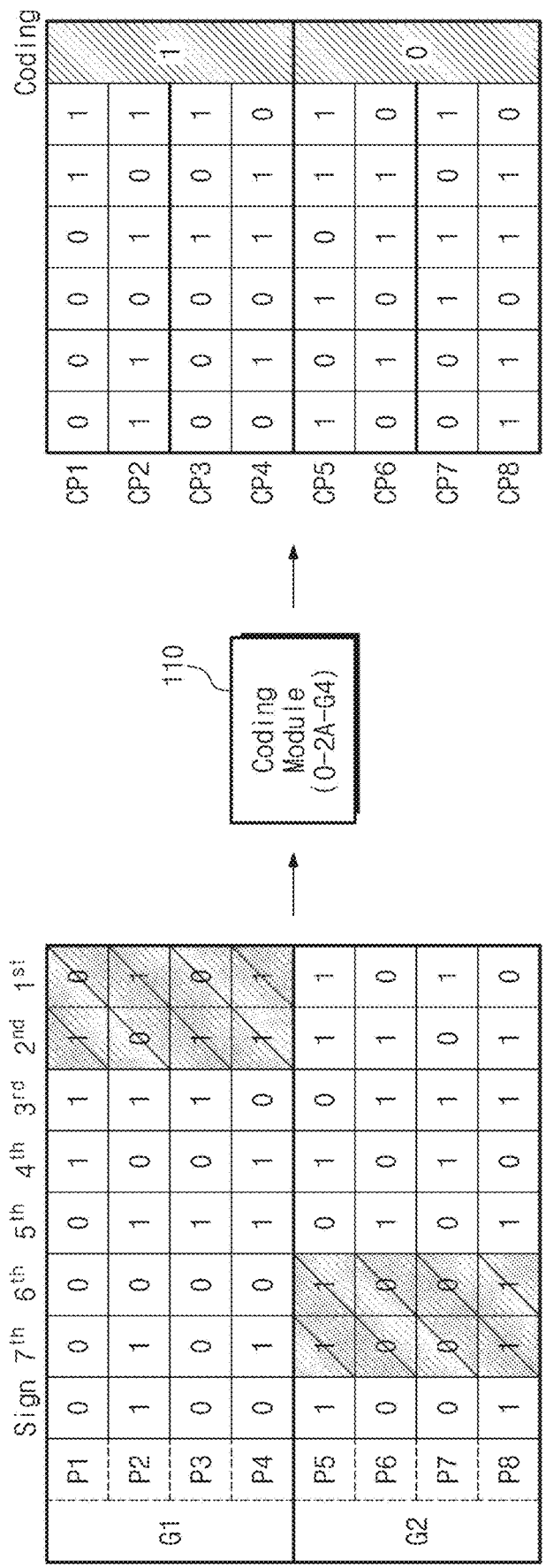
FIG. 12 illustrates another example in which a coding module of FIG. 1 groups and compresses a plurality of weight parameters.

FIG. 12 illustrates another example in which a coding module of FIG. 1 groups and compresses a plurality of weight parameters. The coding module 110 may group the plurality of weight parameters P1 to P8 into groups G1 and G2. For example, the number of weight parameters per group may be "4", but the inventive concept is not limited thereto. As in the outlier-aware approximation coding O-2A-

G2 of FIG. 11, when at least one of weight parameters in one group is an outlier, the coding module 110 may truncate two lower bits of each of the weight parameters in the group; when all weight parameters in one group are a non-outlier, the coding module 110 may truncate two upper bits of each of the weight parameters in the group.

The coding module 110 may compare each of the weight parameters P1 to P4 of the group G1 with the reference value, may classify the weight parameters P1 and P3 as a non-outlier and the weight parameters P2 and P4 as an outlier, may compress each of the weight parameters P1 to P4 by truncating two lower bits, and may add a coding bit, which indicates that one of the weight parameters P1 to P4 of the group G1 is an outlier and has the second value, to the compressed weight parameters CP1 to CP4. The coding module 110 may compare each of the weight parameters P5 to P8 of the group G2 with the reference value, may classify all the weight parameters P5 to P8 as a non-outlier, may compress each of the weight parameters P5 to P8 by truncating the remaining bits other than a sign bit among three upper bits, and may add a coding bit, which indicates that all the weight parameters P5 to P8 of the group G2 are non-outliers and has the first value, to the compressed weight parameters CP5 to CP8. The coding module 110 may group and compress the plurality of weight parameters P1 to P8, based on the outlier-aware approximation coding O-2A-G4. Although not illustrated, the coding module 110 may group and compress a plurality of activation parameters based on the outlier-aware approximation coding O-2A-G4. In the O-2A-G1, O-2A-G2, and O-2A-G4, "1", "2", and "4" attached to "G" may mean the number of parameters in one group. As the number of parameters in one group increases, the degree to which the plurality of parameters P1 to P8 are compressed by the coding module 110, that is, a compression rate may increase.

Figure 13:
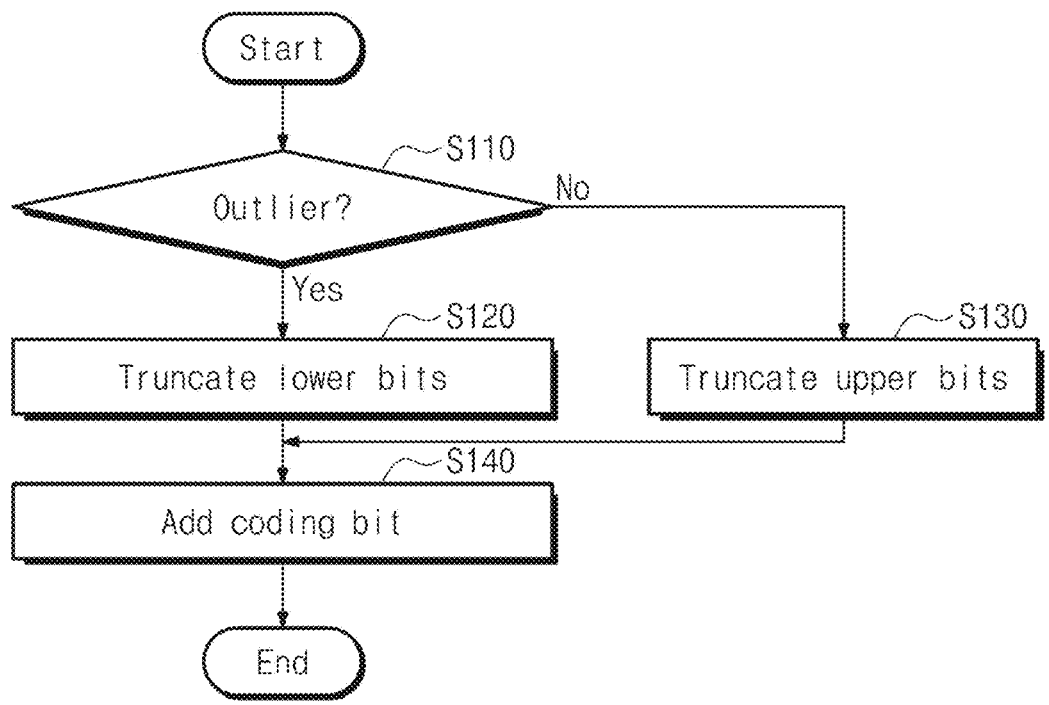
FIG. 13 is a flowchart illustrating how a coding module of FIG. 1 compresses a parameter.

FIG. 13 is a flowchart illustrating how a coding module of FIG. 1 compresses a parameter. In operation S110, the coding module 110 may determine whether a parameter of the artificial neural network is an outlier, depending on a value of the parameter. As described above, the parameter may be a weight parameter or an activation parameter. For example, the coding module 110 may compare an absolute value of the parameter and the reference value. When the absolute value of the parameter is less than the reference value (or is the reference value or less), the coding module 110 may determine that the parameter is a non-outlier; when the absolute value of the parameter is the reference value or more (or exceeds the reference value), the coding module 110 may determine that the parameter is an outlier. For example, when all upper bits of the parameter including an MSB are "0" or "1", the coding module 110 may determine the parameter as a non-outlier. When at least two of the upper bits of the parameter including an MSB are different from each other, the coding module 110 may determine the parameter as an outlier.

When the parameter is an outlier (Y), in operation S120, the coding module 110 may truncate the LSB (refer to a $1^{st}$ bit of FIGS. 6 and 7 and a $1^{st}$ bit of FIG. 9) of the parameter and may truncate the second LSB (refer to a $2^{nd}$ bit of FIGS. 6 and 7 and a $2^{nd}$ bit of FIG. 9) of the parameter. As described above, the coding module 110 may group a plurality of parameters (refer to FIGS. 11 and 12) and may compress the plurality of parameters. When at least one of the plurality of parameters is an outlier, the coding module 110 may truncate the LSB and the second LSB of each of the plurality of parameters. For example, the number of lower bits of a parameter truncated by the coding module 110 may be one or more.

When the parameter is a non-outlier (N), in operation S130, the coding module 110 may truncate the MSB (refer to the $7^{th}$ bit of FIGS. 4 and 5 and the $8^{th}$ bit of FIG. 8) of the parameter and may truncate the second MSB (refer to the $6^{th}$ bit of FIGS. 4 and 5 and the $7^{th}$ bit of FIG. 8) of the parameter. As described above, the coding module 110 may group a plurality of parameters and may compress the plurality of parameters. When each of the plurality of parameters is a non-outlier, the coding module 110 may truncate the MSB and the second MSB (or an upper bit next to the MSB) of each of the plurality of parameters. For example, the number of upper bits of a parameter truncated by the coding module 110 may be one or more.

The coding module 110 may truncate a lower bit(s) of the parameter in operation S120 or may truncate an upper bit(s) of the parameter in operation S130. In operation S140, the coding module 110 may add a coding bit indicating whether the parameter is an outlier and may generate a compressed parameter. As described above, the coding module 110 may group a plurality of parameters and may compress the plurality of parameters. In this case, the coding bit may indicate whether at least one of a plurality of parameters in one group is an outlier.

In an embodiment, although not illustrated, the electronic device 100a may transmit a parameter compressed by the coding module 110 to a memory device and may then receive the compressed parameter from the memory device. The decoding module 120 may decode, decompress, or restore the compressed parameter.

Figure 14:
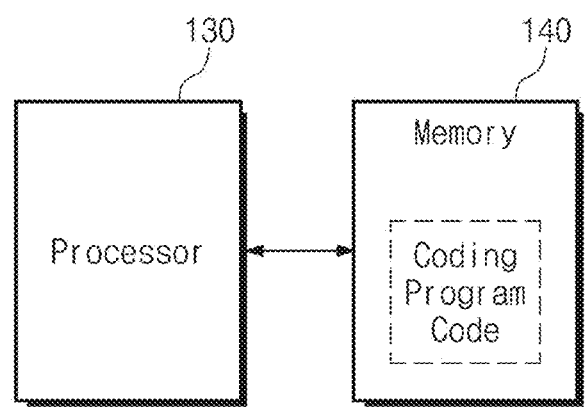
FIG. 14 illustrates a block diagram of an electronic device according to an embodiment of the inventive concept.

FIG. 14 illustrates a block diagram of an electronic device according to an embodiment of the inventive concept. An electronic device 100b may be another example of the electronic device 100a. The electronic device 100b may include a processor 130 and a memory 140. The processor 130 may execute a coding program code stored in the memory 140 as a hardware device. For example, the processor 130 may include a plurality of homogeneous or heterogeneous cores, such as a central processing unit (CPU), an image signal processing unit (ISP), a digital signal processing unit (DSP), a graphics processing unit (GPU), a tensor processing unit (TPU), a vision processing unit (VPU), and a neural processing unit (NPU), a cache memory that is shared by the plurality of cores, etc. The processor 130 may perform processing operations and arithmetic operations, which are associated with instructions of the coding program code, such as fetch, execution, data request, and data store. The memory 140 may be a non-transitory computer-readable medium storing the coding program code executable by the processor 130, that is, a hardware device. For example, the coding program code that is stored in the memory 140 and is executed by the processor 130 may include instructions associated with the outlier-aware approximation coding O-2A that is performed by the coding module 110 and the decoding module 120 described with reference to FIG. 1. For example, by executing the coding program code loaded onto the memory 140, the processor 130 may compress a parameter or may decompress a compressed parameter and may perform operation S110 to operation S140 of FIG. 13. For another example, the memory 140 may further store an artificial neural network program code executable by the processor 130. The processor 130 may execute the artificial neural network by executing the artificial neural network program code loaded on the memory 140. For example, the artificial neural network may include, but is not limited to, a deep neural network (DNN), a convolution neural network (CNN), a recurrent neural network (RNN), a spiking neural network (SNN), etc.

Figure 15:
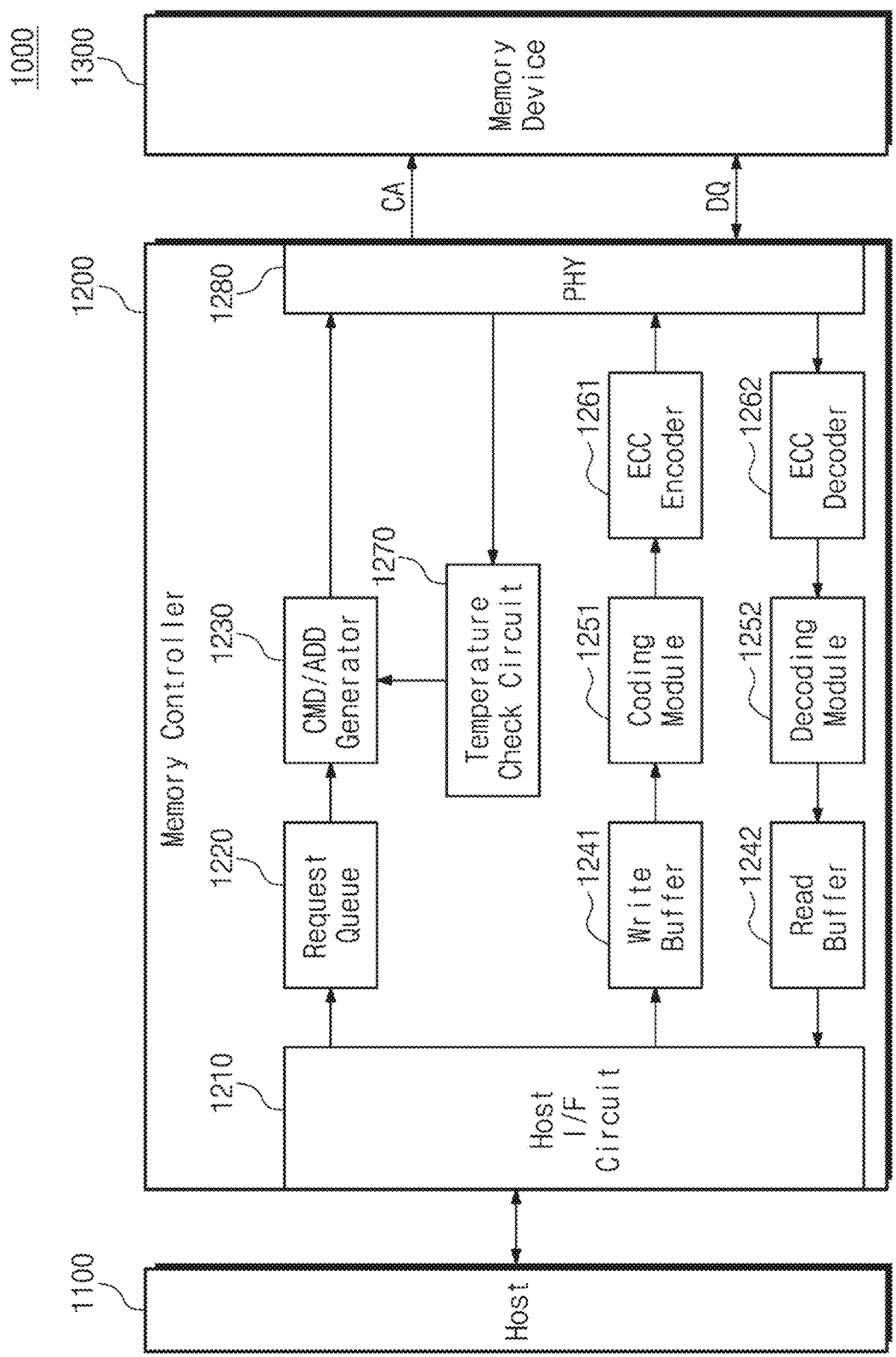
FIG. 15 illustrates a block diagram of an electronic device according to another embodiment of the inventive concept.

FIG. 15 illustrates a block diagram of an electronic device according to an embodiment of the inventive concept. An electronic device 1000 may be referred to as an "electronic system", a "computing system", or a "memory system". For example, the electronic device 1000 may be a desktop computer, a laptop computer, a workstation, a server, a mobile device, etc., but the inventive concept is not limited thereto. The electronic device 1000 may include the host 1100, a memory controller 1200, and a memory device 1300.

The host 1100 may execute the artificial neural network by using the memory controller 1200 and the memory device 1300. The host 1100 may transmit a parameter of the artificial neural network to the memory controller 1200 or may request a parameter of the artificial neural network stored in the memory device 1300 from the memory controller 1200. The host 1100 may generate a memory request(s) for writing a parameter of the artificial neural network to the memory device 1300 or reading a parameter of the artificial neural network from the memory device 1300. For example, the artificial neural network may include, but is not limited to, a deep neural network (DNN), a convolution neural network (CNN), a recurrent neural network (RNN), a spiking neural network (SNN), etc.

The memory controller 1200 may access and control the memory device 1300 in a direct memory access (DMA) manner, based on a memory request transmitted from the host 1100. The memory controller 1200 may include a request queue 1220, a command and address generator 1230, a write buffer 1241, a read buffer 1242, a coding module 1251, a decoding module 1252, an error correction code (ECC) encoder 1261, an ECC decoder 1262, a temperature check circuit 1270, and a physical layer (PHY) 1280. The above components may be implemented in the form of hardware, software, or a combination thereof. For example, one example of the electronic device 100a of FIG. 1 may be the memory controller 1200.

A host interface circuit 1210 may receive memory requests from the host 1100 based on a communication protocol with the host 1100. For example, the memory requests may be associated with a parameter of the artificial neural network that is executed by the host 1100. The host interface circuit 1210 may provide the received memory requests to the request queue 1220. The host interface circuit 1210 may receive parameters of the artificial neural network from the host 1100. The host interface circuit 1210 may provide the received parameters to the write buffer 1241. The host interface circuit 1210 may receive parameters from the read buffer 1242. The host interface circuit 1210 may transmit the received parameters to the host 1100. The request queue 1220 may store memory requests provided from the host interface circuit 1210. The command and address generator 1230 may fetch the memory requests stored in the request queue 1220 and may convert and generate the fetched memory requests into commands and addresses for the memory device 1300. For example, a command may include an activate command, a read command, a write command, a precharge command, an erase command, etc. For example, an address may indicate a position of the memory device 1300, at which a parameter will be stored, or may indicate a position of the memory device 1300, at which a parameter is stored. The command and address generator 1230 may adjust or schedule the order of processing commands and addresses. The command and address generator 1230 may provide the commands and the addresses to the PHY 1280 based on the above order. The write buffer 1241 may store a parameter of the artificial neural network provided from the host interface circuit 1210. The write buffer 1241 may provide the stored parameter to the coding module 1251. The read buffer 1242 may store a decompressed parameter of the artificial neural network provided from the decoding module 1252. The read buffer 1242 may provide the stored parameter to the host interface circuit 1210.

The coding module 1251 may correspond to the coding module 110 described with reference to FIGS. 1 to 13. The coding module 1251 may receive a parameter from the write buffer 1241, may compress the parameter, and may provide the compressed parameter to the ECC encoder 1261. Unlike the example of FIG. 15, the memory controller 1200 may not include the ECC encoder 1261; in this case, the coding module 1251 may directly provide the compressed parameter to the PHY 1280. The decoding module 1252 may correspond to the decoding module 120 described with reference to FIGS. 1 to 13. The decoding module 1252 may receive a parameter from the ECC decoder 1262. Unlike the example of FIG. 15, the memory controller 1200 may not include the ECC decoder 1262; in this case, the decoding module 1252 may directly receive the compressed parameter from the PHY 1280. The decoding module 1252 may decode, decompress, or restore the received parameter. The decoding module 1252 may output a parameter to the read buffer 1242.

Based on an error correction code (e.g., a Hamming code, a BCH (Bose-Chauduhuri-Hocquenghen) code, an RS (Reed-Solomon) code, a Viterbi code, a Turbo code, an LDPC (low density parity check)), the ECC encoder 1261 may encode a compressed parameter, may generate parity bits, and may add the parity bits to the compressed parameter. The ECC encoder 1261 may provide the compressed parameter including the parity bits to the PHY 1280. The ECC decoder 1262 may decode a parameter provided from the PHY 1280 based on an error correction code. The ECC decoder 1262 may perform an error correction operation by using parity bits of the decoded parameter. The ECC decoder 1262 may provide the error-corrected parameter to the decoding module 1252. As described above, unlike the example of FIG. 15, the memory controller 1200 may not include the ECC encoder 1261 and the ECC decoder 1262.

The temperature check circuit 1270 may check a temperature of the memory device 1300. The temperature check circuit 1270 may be provided with temperature information of the memory device 1300 from the PHY 1280. The temperature check circuit 1270 may provide the temperature information to the command and address generator 1230. For example, the command and address generator 1230 may adjust a refresh period of the memory device 1300 based on the temperature information of the memory device 1300. In detail, to retain data (i.e., a compressed parameter) stored in the memory device 1300, the command and address generator 1230 may periodically or randomly generate a refresh command to be provided to the memory device 1300. The command and address generator 1230 may adjust a period or a time point at which a refresh command is to be issued, based on the temperature information of the memory device 1300.

The PHY 1280 may be also referred to as a "memory interface circuit". The PHY 1280 may directly communicate with the memory device 1300. The PHY 1280 may operate in compliance with an interface standard, which the memory device 1300 supports, such as a toggle double data rate (DDR) standard, a DDR synchronous dynamic random access memory (SDRAM) standard, or a joint electron device engineering council (JEDEC) standard. The PHY 1280 may drive physical paths forming a channel between the memory controller 1200 and the memory device 1300. The PHY 1280 may receive a command and an address from the command and address generator 1230 and may transmit command/address signals CA to the memory device 1300. The PHY 1280 may receive a compressed parameter from the coding module 1251 or the ECC encoder 1261 and may transmit data input/output signals DQ including the compressed parameter to the memory device 1300. The PHY 1280 may receive the data input/output signals DQ including a compressed parameter from the memory device 1300 and may provide the compressed parameter to the ECC decoder 1262 or the decoding module 1252.

Figure 16:
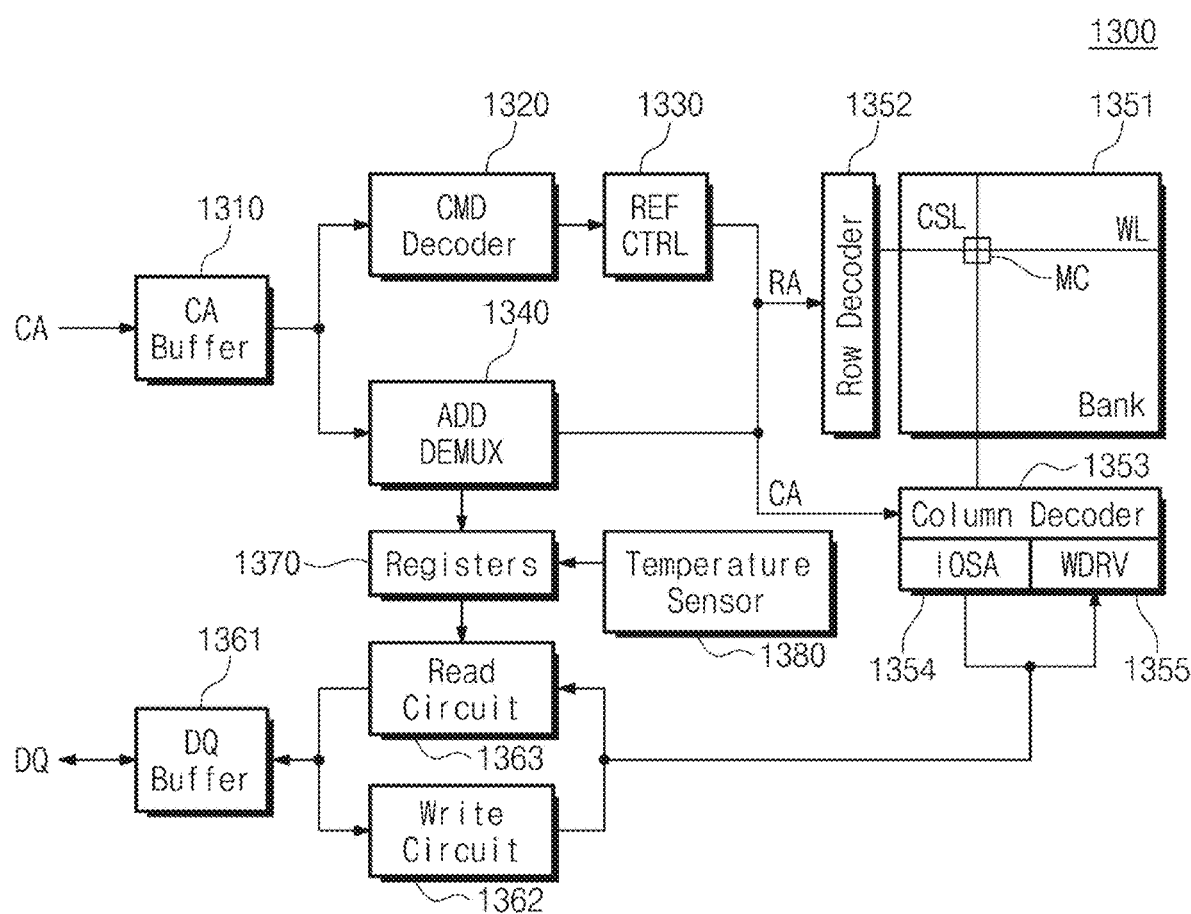
FIG. 16 illustrates a block diagram of a memory device of FIG. 15.

FIG. 16 illustrates a block diagram of a memory device of FIG. 15. The memory device 1300 may include a command and address buffer 1310, a command decoder 1320, a refresh controller 1330, an address demultiplexer 1340, a bank 1351, a row decoder 1352, a column decoder 1353, an input/output sense amplifier 1354, a write driver 1355, a data input/output buffer 1361, a write circuit 1362, a read circuit 1363, registers 1370, and a temperature sensor 1380. The above components may be implemented in the memory device 1300 in the form of hardware.

The command and address buffer 1310 may receive command/address signals CA from the PHY 1280 and may provide the received command/address signals CA to the command decoder 1320 and the address demultiplexer 1340. The command decoder 1320 may decode the command/address signals CA and may control other components of the memory device 1300 based on a command included in the command/address signals CA. For example, the command decoder 1320 may decode the command/address signals CA including a refresh command and may control the refresh controller 1330 based on the refresh command. The refresh controller 1330 may internally generate a row address RA corresponding to memory cells MC of the bank 1351 under control of the command decoder 1320. For example, the refresh controller 1330 may include a counter that changes a value of the row address RA in response to the refresh command. The refresh controller 1330 may provide the row address RA to the row decoder 1352. The address demultiplexer 1340 may receive an address included in the command/address signals CA provided from the command and address buffer 1310. For example, the address demultiplexer 1340 may provide the received address as the row address RA to the row decoder 1352 under control of the command decoder 1320 decoding the activate command or the precharge command. The address demultiplexer 1340 may provide the received address as a column address CA to the command decoder 1320 under control of the command decoder 1320 decoding the read command or the write command. The address demultiplexer 1340 may provide the received address as a setting code, an operation code, or an operand under control of the command decoder 1320 decoding the setting command.

The bank 1351 may include memory cells MC. The bank 1351 may refer to a unit for dividing all the memory cells MC of the memory device 1300. For example, the memory cells MC may be connected with word lines WL and with bit lines connected with a column select line CSL. The memory cells MC may be accessed through the word line WL and the column select line CSL. For convenience of illustration, one bank 1351 is illustrated in FIG. 16, but the memory device 1300 may include one or more banks. The row decoder 1352 may decode the row address RA under control of the command decoder 1320. The row decoder 1352 may select or activate at least one word line WL corresponding to the row address RA under control of the command decoder 1320. The row decoder 1352 may deactivate the activated word line WL under control of the command decoder 1320. The column decoder 1353 may decode the column address CA under control of the command decoder 1320. The column decoder 1353 may select or activate at least one column select line CSL corresponding to the column address CA under control of the command decoder 1320. One or more bit lines may be connected with the column select line CSL. For example, memory cells MC corresponding to the row address RA and the column address CA may be selected, and a data input/output operation may be performed on the selected memory cells MC. Under control of the command decoder 1320, the input/output sense amplifier 1354 may sense read data of the selected memory cells MC and may provide the read data to the read circuit 1363. Under control of the command decoder 1320, the write driver 1355 may receive write data from the write circuit 1362 and may write the write data to the selected memory cells MC. For example, each of the read data and the write data may be the parameter of the artificial neural network described above.

The data input/output buffer 1361 may receive the data input/output signals DQ including write data from the PHY 1280 and may provide the write data to the write circuit 1362. The data input/output buffer 1361 may receive read data from the read circuit 1363 and may transmit the data input/output signals DQ including the read data to the PHY 1280. Because the data input/output signals DQ are bidirectional, the data input/output buffer 1361 may include both a receiver (not illustrated) and a transmitter (not illustrated). The write circuit 1362 may receive and deserialize write data from the data input/output buffer 1361. The write circuit 1362 may provide the write data to the write driver 1355. The read circuit 1363 may receive and serialize read data from the input/output sense amplifier 1354. The read circuit 1363 may provide the read data to the data input/output buffer 1361.

The registers 1370 may store the setting code provided from the address demultiplexer 1340, that is, setting information under control of the command decoder 1320. For example, the registers 1370 may be referred to as "mode registers" or "multi-purpose registers". The memory controller 1200 may change values stored in the registers 1370 and may set or adjust an operation condition, an operation mode, etc. of the memory device 1300. The temperature sensor 1380 may sense a temperature in the memory device 1300. The temperature sensor 1380 may store a value indicating a temperature in the registers 1370. The memory controller 1200 may transmit the command/address signals CA including a command for reading the registers 1370 to the memory device 1300. A value of a temperature that is sensed by the temperature sensor 1380 may be stored in the registers 1370, and the value stored in the registers 1370 may be transmitted to the memory controller 1200 in response to the above-described command. For example, the command decoder 1320 may decode the command for reading the registers 1370, the registers 1370 may transmit the value of the sensed temperature to the read circuit 1363, the read circuit 1363 may provide the value of the sensed temperature as read data to the data input/output buffer 1361, and the data input/output buffer 1361 may transmit the data input/output signals DQ including the value of the sensed temperature to the PHY 1280 of the memory controller 1200. The PHY 1280 may provide the data input/output signals DQ and may provide the value of the sensed temperature included in the data input/output signals DQ to the temperature check circuit 1270.

In an embodiment, the memory device 1300 may include various DRAM devices such as a double data rate synchronous dynamic random access memory (DDR SDRAM), DDR2 SDRAM, DDR3 SDRAM, DDR4 SDRAM, DDR5 SDRAM, a low power double data rate (LPDDR) SDRAM, LPDDR2 SDRAM, LPDDR3 SDRAM, LPDDR4 SDRAM, LPDDR4X SDRAM, LPDDR5 SDRAM, a graphics double data rate synchronous graphics random access memory (GDDR SGRAM), GDDR2 SGRAM, GDDR3 SGRAM, GDDR4 SGRAM, GDDR5 SGRAM, GDDR6 SGRAM, etc. The memory controller 1200 may communicate with one or more memory devices 1300 constituting a memory module. The memory module may be a dual in-line memory module (DIMM), a registered DIMM (RDIMM), a load reduced DIMM (LRDIMM), an unbuffered DIMM (UDIMM), a fully buffered DIMM (FB-DIMM), a small outline DIMM (SO-DIMM), or any other memory module (e.g., a single in-line memory module (SIMM)), which complies with the joint electron device engineering council (JEDEC) standard.

It is assumed that the memory device 1300 or the memory module has 8-byte or 4-byte data bus and a parameter of the artificial neural network is composed of 8 bits (i.e., INT8). For example, the data bus may mean paths through which the data input/output signals DQ are transmitted between the memory controller 1200 and the memory device 1300 or the memory module. The 8-byte or 4-type may be an example of a bit width or a bit length of the data bus, a transfer unit of the data input/output signals DQ, and a data input/output unit. According to the above assumption, the memory controller 1200 may simultaneously transmit 8 or 4 parameters to the memory device 1300 or the memory module or may simultaneously receive 8 or 4 parameters from the memory device 1300 or the memory module. Here, the 8 or 4 parameters may not be compressed. In the case where the memory controller 1200 compresses the above parameters, the memory controller 1200 may transmit a relatively larger number of compressed parameters to the memory device 1300 or the memory module.

TABLE 1

| Code | Bitwidth | Data | Compressed Data | Parity | Unused | Rate |
|---|---|---|---|---|---|---|
| O-2A-G10 | 8 bytes | 10 bytes | 61 bits/8 bytes | — | 3 bits | 80% |
| O-2A-G5 | 4 bytes | 5 bytes | 31 bits/4 bytes | — | 1 bit | 80% |
| O-2A-G9 & ECC | 8 bytes | 9 bytes | 61 bits/8 bytes | 6 bits | 3 bits | 89% |
| O-2A-G4 & ECC | 4 bytes | 4 bytes | 30 bits/4 bytes | 5 bits | 2 bits | 100% |

Table 1 shows compression rates according to kinds of coding that the memory controller 1200 performs. It is assumed that the coding module 1251 and the decoding module 1252 of the memory controller 1200 operate based on the outlier-aware approximation coding O-2A-G10. The coding module 1251 may compress 10-byte data including a plurality of parameters, and the size of the compressed data including the plurality of compressed parameters may be 61 bits. In the case where the data bus is 8 bytes wide and the number of unselected bits of 8 bytes is "3", a compression rate may be approximately 80% (=8/10) on a byte basis. It is assumed that the coding module 1251 and the decoding module 1252 of the memory controller 1200 operate based on the outlier-aware approximation coding O-2A-G5. The coding module 1251 may compress 5-byte data including a plurality of parameters, and the size of the compressed data including the plurality of compressed parameters may be 31 bits. In the case where the memory controller 1200 communicates with the memory device 1300 by using a 4-byte data bus, the number of unselected bits of 4 bytes is "1", and a compression rate may be approximately 80% (=4/5) on a byte basis. It is assumed that the coding module 1251 and the decoding module 1252 of the memory controller 1200 operate based on the outlier-aware approximation coding O-2A-G9 and the ECC encoder 1261 and the ECC decoder 1262 operate based on an ECC code. The coding module 1251 may compress 9-byte data including a plurality of parameters, the ECC encoder 1261 may generate 6 parity bits, and the size of the compressed data including the 6 parity bits and the plurality of compressed parameters may be 61 bits. In the case where the data bus is 8 bytes wide and the number of unselected bits of 8 bytes is "3", a compression rate may be approximately 89% (=8/9) on a byte basis. It is assumed that the coding module 1251 and the decoding module 1252 of the memory controller 1200 operate based on the outlier-aware approximation coding O-2A-G4 and the ECC encoder 1261 and the ECC decoder 1252 operate based on an ECC code. The coding module 1251 may compress 4-byte data including a plurality of parameters, the ECC encoder 1261 may generate 5 parity bits, and the size of the compressed data including the 5 parity bits and the plurality of compressed parameters may be 30 bits. In the case where the data bus is 4 bytes wide and the number of unselected bits of 4 bytes is "2", a compression rate may be approximately 100% (=4/4) on a byte basis.

The memory controller 1200 may add a parity bit to compressed data or may not add a parity bit to compressed data. In the case where a parity bit is not added to compressed data, the memory controller 1200 may simultaneously transmit a relatively larger number of parameters to the memory device 1300 or the memory module or may simultaneously receive a relatively larger number of parameters from the memory device 1300 or the memory module. In the case where a parity bit is added to compressed data, the number of parameters to be simultaneously transmitted may decrease relatively, but the memory controller 1200 may relatively increase (elongate) a refresh period of the memory device 1300 (or may make a refresh speed low). The memory controller 1200 may partially allow or manage a retention error due to a decrease of a refresh speed of the memory device 1300 based on the ECC code, and the power or energy of the memory device 1300 performing the refresh operation may decrease. The scope of the inventive concept is not limited to Table 1 above and numerical values of Table 1.

Figure 17:
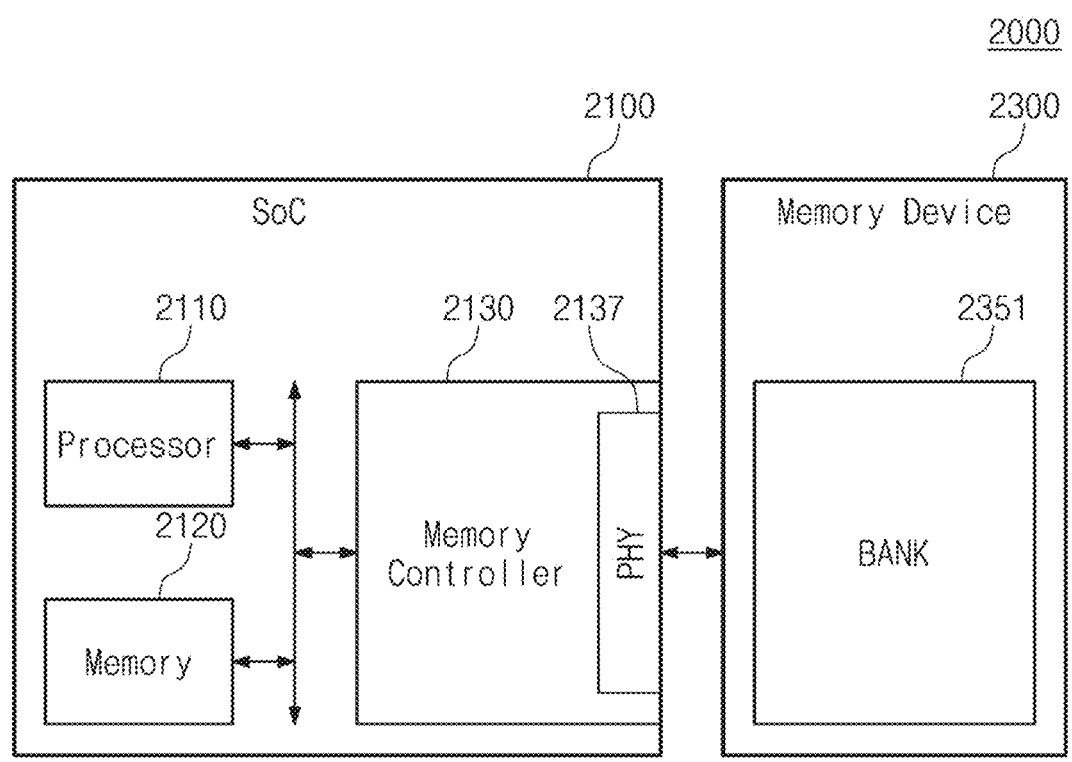
FIG. 17 illustrates an exemplary block diagram of an electronic device according to another embodiment of the inventive concept.

FIG. 17 illustrates is an exemplary block diagram of an electronic device according to another embodiment of the inventive concept. An electronic device 2000 may include a system-on-chip (SoC) 2100 and a memory device 2300. The SoC 2100 may include a memory controller 2130 including a processor 2110, a memory 2120, and a PHY 2137. The memory controller 2130 may be the memory controller 1200 described with reference to FIG. 16. The PHY 2137 may be the PHY 1280 described with reference to FIG. 15. The memory device 2300 may include a bank 2351 and may be the memory device 1300. For convenience of illustration, only the bank 2351 being the bank 1351 is illustrated, but the memory device 2300 may include the components of the memory device 1300.

The processor 2110 may correspond to the host 1100 described with reference to FIG. 15. The processor 2110 may execute various software (e.g., an application program, an operating system, a file system, and a device driver) loaded onto the memory 2120. The processor 2110 may include homogeneous multi-core processors or heterogeneous multi-core processors. For example, the processor 2110 may include at least one of a CPU, an ISP, a DSP, a GPU, a TPU, a VPU, and an NPU An application program, an operating system, a file system, a device driver, etc. for driving the electronic device 2000 may be loaded onto the memory 2120. For example, the memory 2120 may be an SRAM device that is implemented in the SoC 2100 and has a faster data input/output speed than the memory device 2300 and may be implemented by using registers, latches, or flip-flops. The memory 2120 may be referred to as an "on-chip memory" or a "buffer memory".

The memory 2120 may be a non-transitory computer-readable medium that stores a program code. The memory 2120 may be a random access memory (RAM), a flash memory, a read only memory (ROM), an electrically programmable ROM (EPROM), an electrically erasable programmable ROM (EEPROM), a register, a hard disk drive, a removable disk, a CD-ROM, or any type of storage medium. As illustrated in FIG. 17, the memory 2120 may be implemented in the SoC 2100; alternatively, unlike the example illustrated in FIG. 17, the memory 2120 may be a storage medium that is implemented in the electronic device 2000 to be independent of the SoC 2100 or is placed outside the electronic device 2000.

In an embodiment, a program code that is stored in or loaded onto the memory 2120 may be executed by the processor 2110. Under control of the processor 2110 executing the program code, the memory controller 2130 may perform operation S110 to operation S140 of the flowchart of FIG. 13. In an embodiment, the program code stored in the memory 2120 may be executed by another processor (not illustrated) in the memory controller 2130, which is different from the processor 2110. The processor in the memory controller 2130 may execute the program code and may perform operation S110 to operation S140 of the flowchart of FIG. 13.

In an embodiment, the processor 2100, the memory 2120, and the memory controller 2130 of the SoC 2100 may be interconnected through a bus. The bus may be of an AMBA (Advanced Microcontroller Bus Architecture) standard bus protocol type. A bus type of AMBA may include an AHB (Advanced High-Performance Bus), an APB (Advanced Peripheral Bus), or an AXI (Advanced eXtensible Interface).

Figure 18:
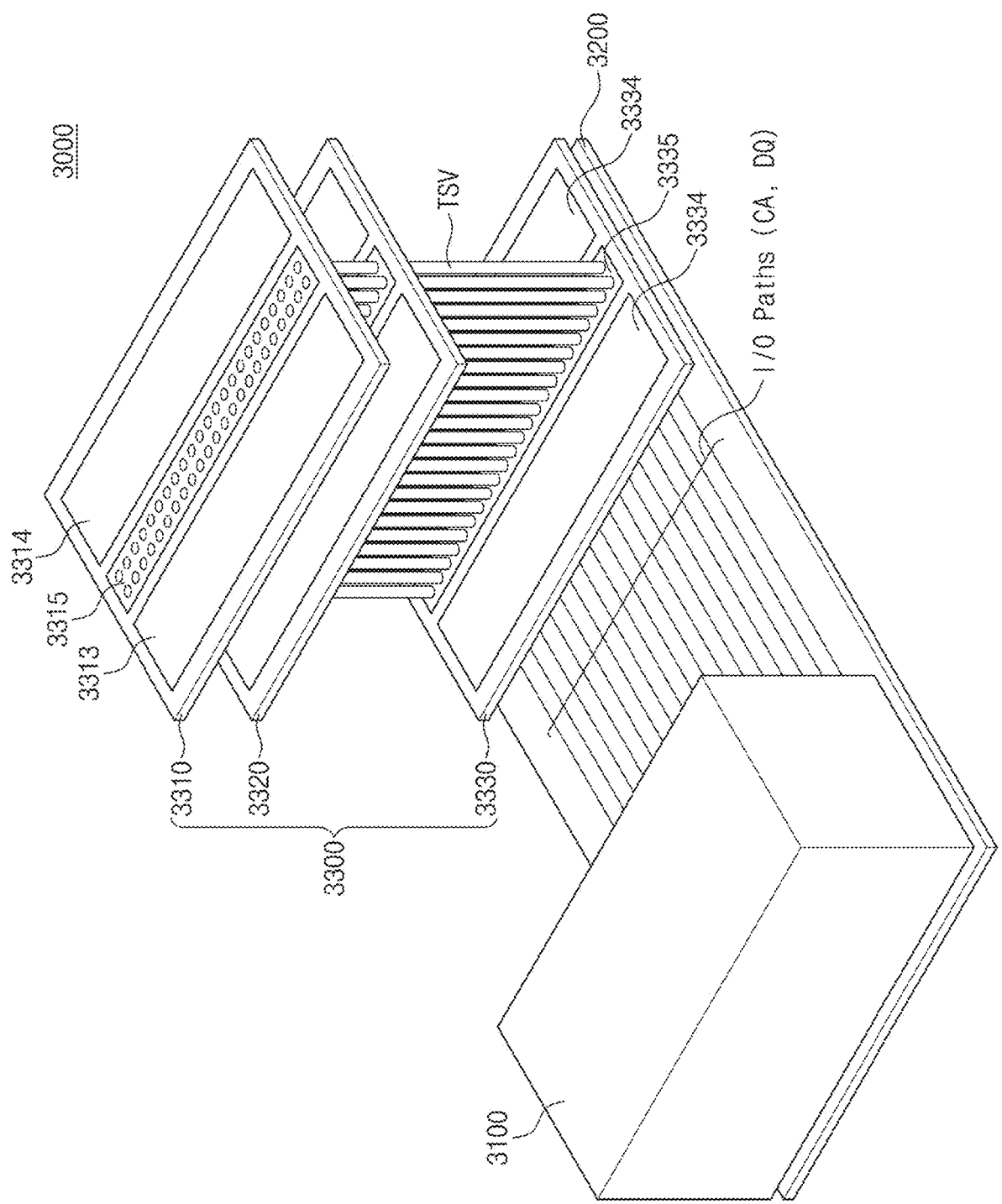
FIG. 18 illustrates an exemplary block diagram of an electronic device according to another embodiment of the inventive concept.

FIG. 18 illustrates an exemplary block diagram of an electronic device according to another embodiment of the inventive concept. An electronic device 3000 may include a SoC 3100, a board 3200, and a memory device 3300.

The SoC 3100 may be disposed on one surface of the board 3200, and solder balls or bumps may be disposed on one surface of the SoC 3100. The SoC 3100 and the board 3200 may be electrically interconnected through the solder balls or the bumps. The SoC 3100 may include the processor 2110, the memory 2120, the memory controller 2130, etc. described with reference to FIG. 17. The memory controller of the SoC 3100 may perform operation S110 to operation S140 of the flowchart FIG. 13.

The board 3200 may provide an input/output path between the SoC 3100 and the memory device 3300. For example, the board 3200 may include a printed circuit board, a flexible circuit board, a ceramic substrate, or an interposer.

In the case where the board 3200 is the interposer, the board 3200 may be implemented by using a silicon wafer. A plurality of input/output paths may be implemented within the board 3200. The command/address signals CA and the data input/output signals DQ may be transmitted through the input/output paths.

The memory device 3300 may include memory dies 3310 and 3320 and a buffer die 3330, which are stacked in a vertical direction. The memory device 3300 may be a memory device, in which DRAM dies are stacked, such as a high bandwidth memory (HBM), HBM2, HBM3, etc. The memory device 3300 may be disposed on one surface of the board 3200, and solder balls or bumps may be disposed on one surface of the memory device 3300. The memory device 3300 and the board 3200 may be electrically interconnected through the solder balls or the bumps.

Through-silicon vias TSV may provide physical or electrical paths between the memory dies 3310 and 3320 and the buffer die 3330. For example, the through-silicon vias TSV may be arranged in the form of a matrix, and locations of the through-silicon vias TSV are not limited to the example of FIG. 18.

The memory die 3310 may include a first area 3313 and 3314 and a second area 3315. The components of the memory device 1300 described with reference to FIG. 16 may be disposed in the first area 3313 and 3314. The through-silicon vias TSV may be disposed in the second area 3315; circuits for transmitting or receiving signals through the through-silicon vias TSV may be disposed in the second area 3315. The memory die 3320 may be implemented to be substantially identical to the memory die 3310.

The buffer die 3330 (referred to as a "core die" or a "logic die") may include a first area 3334 and a second area 3335. At least one receiver that receives the command/address signals CA and the data input/output signals DQ transmitted through input/output (I/O) paths from the SoC 3100 may be disposed in the first area 3334. At least one transmitter that transmits the data input/output signals DQ to the SoC 3100 through the input/output paths may be disposed in the first area 3334. Also, the components of the memory device 1300 described with reference to FIG. 16 may be disposed in the first area 3334. The through-silicon vias TSV may be disposed in the second area 3335; circuits for transmitting or receiving signals through the through-silicon vias TSV may be disposed in the second area 3335. In an embodiment, the buffer die 3330 may include the processor 2110, the memory 2120, the memory controller 2130, etc. described with reference to FIG. 17. Also, the buffer die 3330 may include the components of the memory controller 1200 described with reference to FIG. 15.

Figure 19:
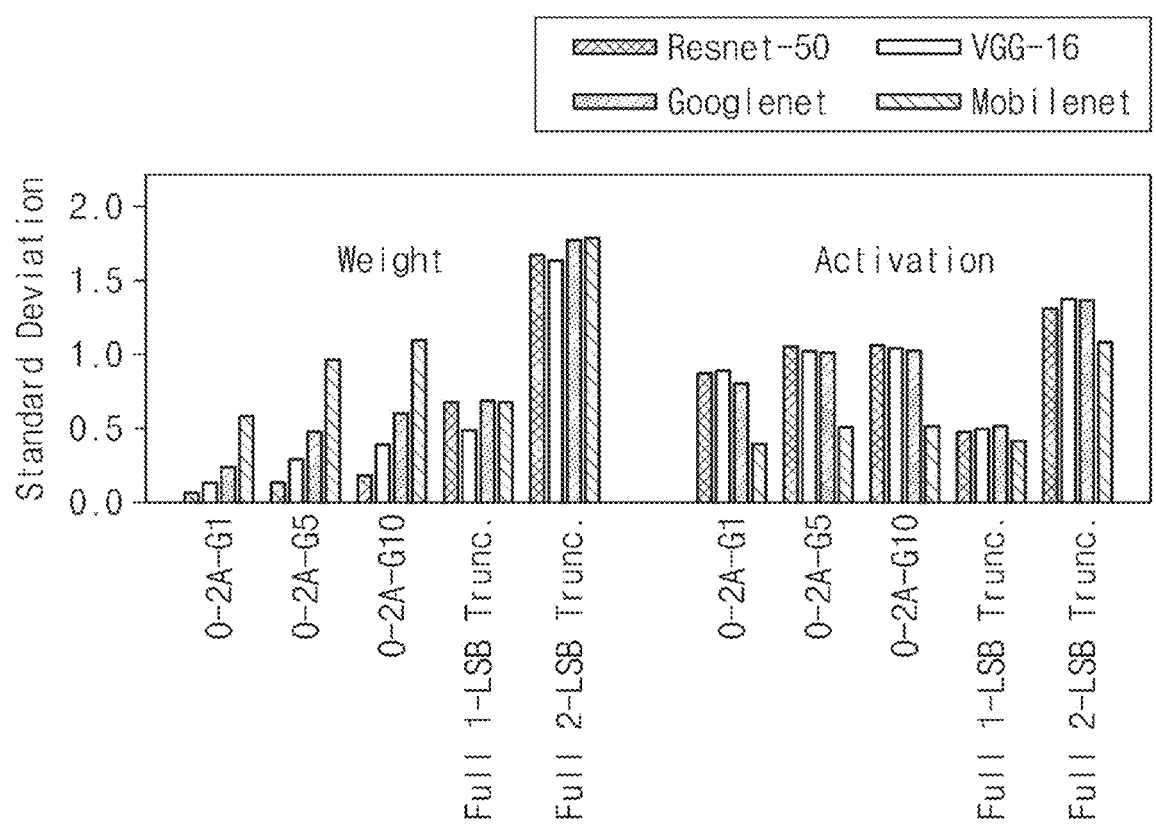
FIG. 19 illustrates standard deviations of weight and activation parameters according to outlier-aware approximation coding performed by a memory controller of FIG. 15.

FIG. 19 illustrates standard deviations of weight and activation parameters according to outlier-aware approximation coding performed by a memory controller of FIG. 15. Because the memory controller 1200 may truncate or delete at least one bit of a parameter based on outlier-aware approximation coding, the outlier-aware approximation coding may correspond to a lossy compression technique. For example, the host 1100 may execute the artificial neural networks such as Resnet-50, VGG-16, Googlenet, and Mobilenet. The memory controller 1200 may compress respective parameters of the artificial neural network based on the outlier-aware approximation coding O-2A-G1, O-2A-G5, and O-2A-G10. As the number of parameters of one group increases, a standard deviation of a parameter may increase. Also, referring to FIG. 19, there are illustrated standard deviations of weight and activation parameters according to the coding (e.g., Full 1-LSB truncation and Full 2-LSB truncation), in which one LSB of a parameter or the LSB and the second LSB (or an upper bit next to the LSB) of the parameter are truncated, as well as the outlier-aware approximation coding.

Figure 20:
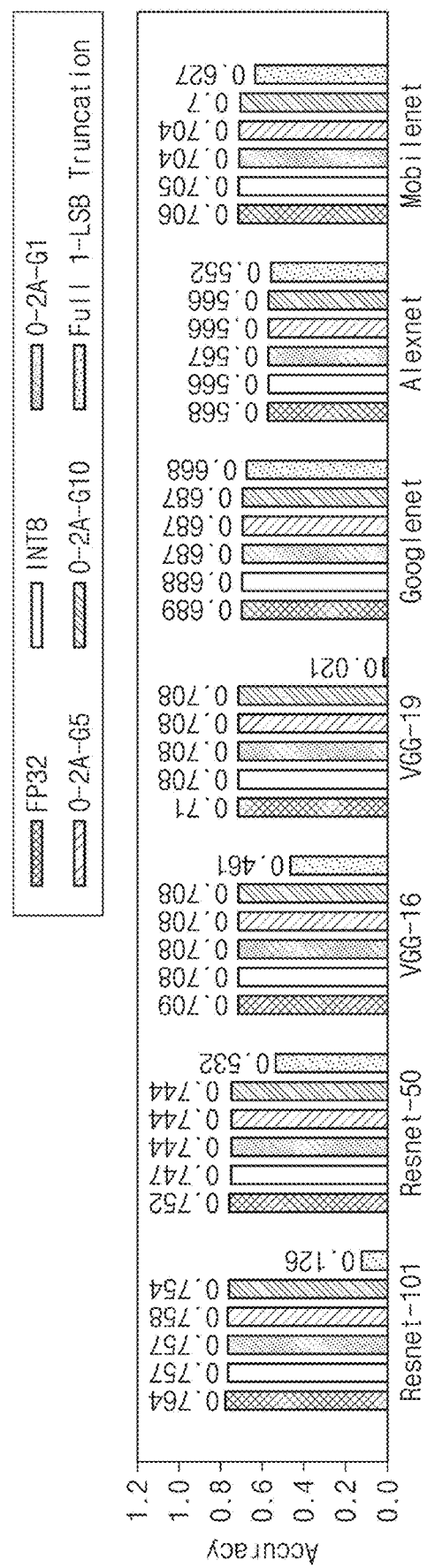
FIG. 20 illustrates accuracy of an artificial neural network according to a format of a parameter.

FIG. 20 illustrates accuracy of an artificial neural network according to a format of a parameter. For example, the host 1100 may execute the artificial neural networks such as Resnet-101, Resnet-50, VGG-16, VGG-19, Googlenet, Alexnet, and Mobilenet. "FP32" may indicate that a parameter is expressed in a 32-bit floating point format, and "INT8" may indicate that a parameter is expressed in a 8-bit format. The accuracy of artificial neural networks using parameters compressed according to the outlier-aware approximation coding O-2A-G1, O-2A-G5, and O-2A-G10 may be almost similar to the accuracy of artificial neural networks using parameters of the FP32 or INT8 case. However, the accuracy of artificial neural networks using parameters compressed according to a coding (Full 1-LSB truncation) (refer to FIG. 19), in which one LSB is truncated, may decrease relatively greatly. For example, the accuracy of the artificial neural network may be associated with inference that is performed by the artificial neural network.

Figure 21:
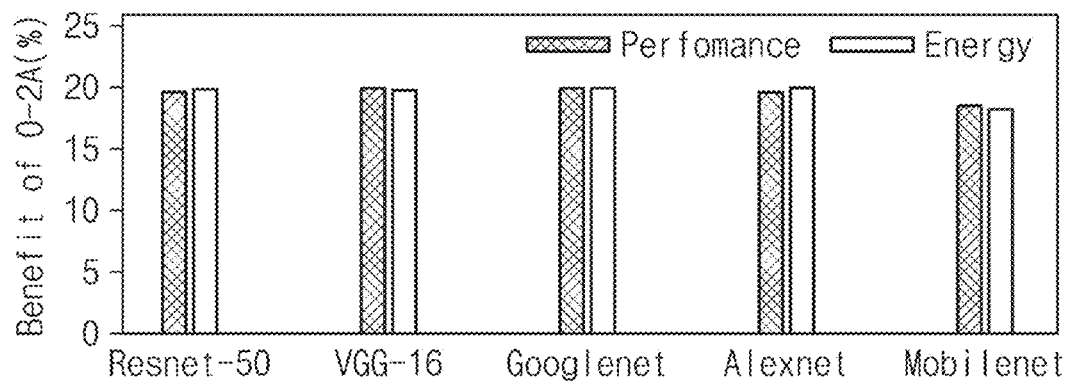
FIG. 21 illustrates performance according to outlier-aware approximation coding and a gain of energy of a memory device of FIG. 16, according to an embodiment of the inventive concept.

FIG. 21 illustrates performance according to outlier-aware approximation coding and a gain of energy of a memory device of FIG. 16, according to an embodiment of the inventive concept. For example, the host 1100 may execute the artificial neural networks such as Resnet-50, VGG-16, Googlenet, Alexnet, and Mobilenet. For example, the memory controller 1200 may compress a parameter from 8 bits to 6 bits, based on the outlier-aware approximation coding. It is assumed that a data bus is 8-bit wide. In the case where a parameter is not compressed, the memory controller 1200 may issue one write command and may transmit 8 parameters to the memory device 1300. In the case where a parameter is compressed, the memory controller 1200 may issue one write command and may transmit 10 parameters to the memory device 1300. Accordingly, because the memory controller 1200 compresses a parameter based on the outlier-aware approximation coding and transmits the compressed parameter to the memory device 1300, the efficiency of access to the memory device 1300 may be improved. Referring to FIG. 21, the performance of system may be improved as much as approximately 18 to 20%, and the energy of the memory device 1300 may also be improved as much as approximately 18 to 20%.

Figure 22:
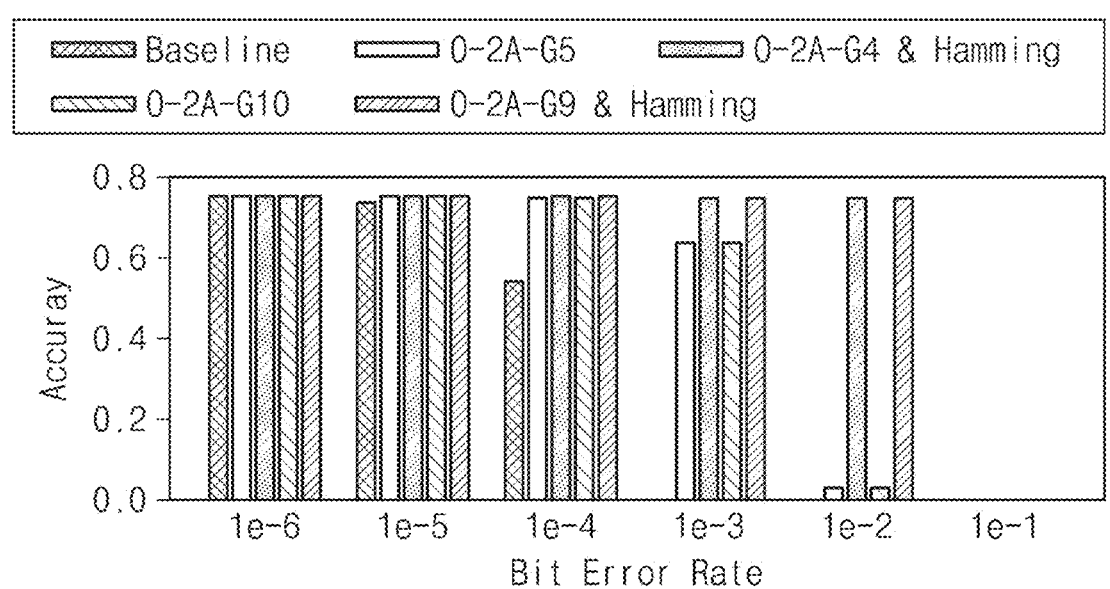
FIG. 22 illustrates a correlation relationship between a bit error rate and accuracy.

FIG. 22 illustrates a correlation relationship between a bit error rate and accuracy. The bit error rate (BER) may relate to a parameter stored in the memory device 1300, and the accuracy may relate to inference of the artificial neural network. For example, the host 1100 may execute the artificial neural network such as Resnet-50. A baseline indicates the accuracy of the artificial neural network using parameters not compressed by the outlier-aware approximation coding according to an embodiment of the inventive concept and may be for comparison. In the case of the baseline, the accuracy of the artificial neural network may gradually decrease from $10^{-6}$ BER order to $10^{-1}$ BER order. Compared to the case where an error occurs at an LSB of a parameter, when an error occurs at an MSB of the parameter, the accuracy of the artificial neural network may relatively more decrease. In the case of the outlier-aware approximation coding O-2A-G5 and O-2A-G10 according to an embodiment of the inventive concept, when a parameter is a non-outlier, upper bits of the parameter may be truncated. Accordingly, the accuracy of the artificial neural networks using parameters compressed by the outlier-aware approximation coding O-2A-G5 and O-2A-G10 may not greatly decrease even at $10^{-3}$ BER order. Also, in the case where the memory controller 1200 performs an error correction operation in addition to the outlier-aware approximation coding O-2A-G4 and O-2A-G9, the accuracy of the artificial neural networks may not almost decrease even at $10^{-2}$ BER order.

Figure 23:
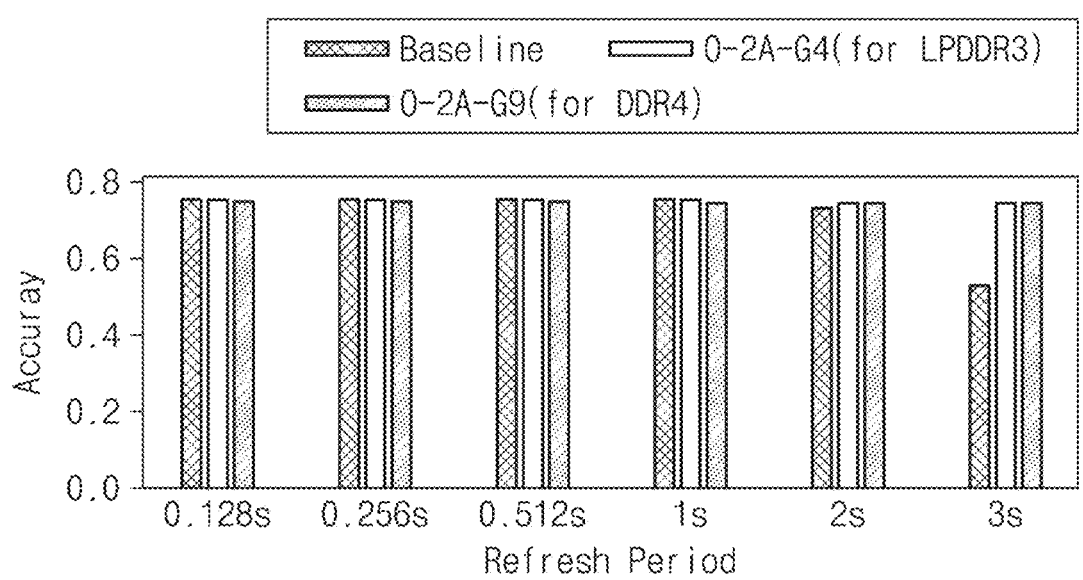
FIG. 23 illustrates a correlation relationship between a refresh period and accuracy.

FIG. 23 illustrates a correlation relationship between a refresh period and accuracy. A refresh period may relate to the memory device 1300 being LPDDR3 or DDR4, and the accuracy may relate to inference of the artificial neural network. For example, the host 1100 may execute the artificial neural network such as Resnet-50. A baseline indicates the accuracy of the artificial neural network using parameters not compressed by the outlier-aware approximation coding according to an embodiment of the inventive concept and may be for comparison. In the case of the baseline, when a refresh period exceeds 2 seconds, the accuracy of the artificial neural network may decrease. In contrast, compared to the baseline, the accuracy of the artificial neural networks using parameters compressed by the outlier-aware approximation coding O-2A-G4 and O-2A-G9 according to an embodiment of the inventive concept may relatively less decrease. The scope of the inventive concept is not limited to numerical values mentioned in the description given with reference to FIGS. 19 to 23.

According to the outlier-aware approximation coding of the inventive concept, in a state where the accuracy of the outlier-aware approximation coding does not almost decrease, the performance of system may be improved, and energy consumption of a memory device may decrease.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An electronic device comprising:
   circuitry configured to
   determine whether a parameter of an artificial neural network is an outlier, depending on a value of the parameter and to compress the parameter by truncating a first bit of the parameter when the parameter is a non-outlier and truncating a second bit of the parameter when the parameter is the outlier,
   store the compressed parameter in a memory device,
   decode the compressed parameter, and
   provide the decoded parameter as a weight parameter for an artificial neural network operation.

2. The electronic device of claim 1, wherein the circuitry is further configured to:
   compare the value of the parameter and a reference value; and
   determine whether the parameter is the outlier, depending on a comparison result.

3. The electronic device of claim 2, wherein the circuitry is further configured to:
   determine the parameter as the non-outlier when the value of the parameter is less than the reference value; and
   determine the parameter as the outlier when the value of the parameter is the reference value or more.

4. The electronic device of claim 1, wherein the circuitry is further configured to:
   determine the parameter as the non-outlier when all upper bits of the parameter, which include the first bit, are "0" or "1"; and determine the parameter as the outlier when at least two of the upper bits are different from each other.

5. The electronic device of claim 1, wherein the first bit corresponds to a most significant bit (MSB) of the parameter, and
wherein the second bit corresponds to a least significant bit (LSB) of the parameter.

6. The electronic device of claim 5, wherein the circuitry is further configured to:
further truncate a lower bit next to the first bit when the parameter is the non-outlier; and
further truncate an upper bit next to the second bit when the parameter is the outlier.

7. The electronic device of claim 1, wherein the circuitry is further configured to:
generate the compressed parameter by truncating one of the first bit and the second bit and adding a coding bit indicating whether the parameter is the outlier.

8. The electronic device of claim 1, wherein the circuitry is further configured to:
compress a plurality of parameters including the parameter.

9. The electronic device of claim 8, wherein the circuitry is further configured to:
compress the plurality of parameters by truncating the first bit of each of the plurality of parameters when each of the plurality of parameters is the non-outlier and truncating the second bit of each of the plurality of parameters when the parameter of the plurality of parameters is the outlier.

10. The electronic device of claim 8, wherein the circuitry is further configured to:
generate a plurality of compressed parameters by truncating one of the first bit of each of the plurality of parameters and the second bit of each of the plurality of parameters and adding a coding bit indicating whether one of the plurality of parameters is the outlier.

11. An operating method of an electronic device, comprising:
determining whether a parameter of an artificial neural network is an outlier, depending on a value of the parameter;
truncating a first bit of the parameter when the parameter is a non-outlier and truncating a second bit of the parameter when the parameter is the outlier;
generating a compressed parameter by truncating one of the first bit and the second bit;
storing the compressed parameter in a memory device; and
providing a weight parameter for an artificial neural network operation, the weight parameter based on the stored compressed parameter.

12. The operating method of claim 11, wherein the determining whether the parameter of the artificial neural network is the outlier includes:
determining the parameter as the non-outlier when the value of the parameter is less than a reference value; and
determining the parameter as the outlier when the value of the parameter is the reference value or more.

13. The operating method of claim 11, further comprising:
truncating a lower bit next to the first bit when the parameter is the non-outlier; and
truncating an upper bit next to the second bit when the parameter is the outlier.

14. The operating method of claim 11, wherein the generating of the compressed parameter includes:
adding a coding bit indicating whether the parameter is the outlier.

15. The operating method of claim 11, further comprising:
decoding the compressed parameter.

16. An electronic device comprising:
a host executing an artificial neural network;
a memory device; and
a memory controller configured to
determine whether a parameter of an artificial neural network is an outlier, depending on a value of the parameter, to
compress the parameter by truncating a first bit of the parameter when the parameter is a non-outlier and truncating a second bit of the parameter when the parameter is the outlier,
transmit a compressed parameter to the memory device,
store the compressed parameter in the memory device, and
provide a weight parameter for an artificial neural network operation, the weight parameter based on the stored compressed parameter.

17. The electronic device of claim 16, wherein the memory controller is configured to:
determine the parameter as the non-outlier when the value of the parameter is less than a reference value; and
determine the parameter as the outlier when the value of the parameter is the reference value or more.

18. The electronic device of claim 16, wherein the memory controller is further configured to:
further truncate a lower bit next to the first bit when the parameter is the non-outlier; and
further truncate an upper bit next to the second bit when the parameter is the outlier.

19. The electronic device of claim 16, wherein the memory controller is further configured to:
generate the compressed parameter by truncating one of the first bit and the second bit and adding a coding bit indicating whether the parameter is the outlier.

20. The electronic device of claim 16, wherein the memory controller is further configured to:
decode the compressed parameter transmitted from the memory device.

* * * * *